US007183177B2

(12) United States Patent
Al-Bayati et al.

(10) Patent No.: US 7,183,177 B2
(45) Date of Patent: Feb. 27, 2007

(54) SILICON-ON-INSULATOR WAFER TRANSFER METHOD USING SURFACE ACTIVATION PLASMA IMMERSION ION IMPLANTATION FOR WAFER-TO-WAFER ADHESION ENHANCEMENT

(75) Inventors: Amir Al-Bayati, San Jose, CA (US); Kenneth S. Collins, San Jose, CA (US); Hiroji Hanawa, Sunnyvale, CA (US); Kartik Ramaswamy, San Jose, CA (US); Biagio Gallo, Palo Alto, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 10/989,993

(22) Filed: Nov. 16, 2004

(65) Prior Publication Data

US 2005/0070073 A1    Mar. 31, 2005

Related U.S. Application Data

(63) Continuation-in-part of application No. 10/838,052, filed on May 3, 2004, which is a continuation-in-part of application No. 10/786,410, filed on Feb. 24, 2004, now Pat. No. 6,893,907, which is a continuation-in-part of application No. 10/646,533, filed on Aug. 22, 2003, which is a continuation-in-part of application No. 10/164,327, filed on Jun. 5, 2002, now Pat. No. 6,939,434, which is a continuation-in-part of application No. 09/636,435, filed on Aug. 11, 2000, now Pat. No. 6,494,986.

(51) Int. Cl.
*H01L 21/46* (2006.01)
*H01L 21/30* (2006.01)
(52) U.S. Cl. .................. 438/458; 438/455; 257/E21.32
(58) Field of Classification Search ................ 438/455, 438/458
See application file for complete search history.

(56) References Cited

U.S. PATENT DOCUMENTS 2,344,138 A    3/1944   Drummond ................. 117/107

(Continued)

FOREIGN PATENT DOCUMENTS

EP    0 546 852 A1    6/1993

(Continued)

OTHER PUBLICATIONS

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

*Primary Examiner*—Asok Kumar Sarkar
(74) *Attorney, Agent, or Firm*—Law Office of Robert M. Wallace

(57) ABSTRACT

A method of fabricating a semiconductor-on-insulator structure from a pair of semiconductor wafers, includes forming an oxide layer on at least a first surface of a first one of the wafers and performing a bonding enhancement implantation step by ion implantation of a first species in the first surface of at least either of the pair of wafers. The method further includes performing a cleavage ion implantation step on one of the pair of wafers by ion implanting a second species to define a cleavage plane across a diameter of the wafer at the predetermined depth below the top surface of the one wafer. The wafers are then bonded together by placing the first surfaces of the pair of wafers onto one another so as to form an semiconductor-on-insulator structure. The method also includes separating the one wafer along the cleavage plane so as to remove a portion of the one wafer between the second surface and the cleavage plane, whereby to form an exposed cleaved surface of a remaining portion of the one wafer on the semiconductor-on-insulator structure. Finally, the cleaved surface is smoothed, preferably by carrying out a low energy high momentum ion implantation step.

27 Claims, 14 Drawing Sheets

U.S. PATENT DOCUMENTS

| | | | |
|---|---|---|---|
| 3,109,100 A | 10/1963 | Gecewicz | 250/219 |
| 3,576,685 A | 4/1971 | Swann et al. | 148/187 |
| 3,907,616 A | 9/1975 | Wiemer | 148/188 |
| 4,116,791 A | 9/1978 | Zega | 204/192 |
| 4,176,003 A | 11/1979 | Brower et al. | 430/313 |
| 4,382,099 A | 5/1983 | Legge et al. | 427/34 |
| 4,385,946 A | 5/1983 | Finegan et al. | 148/175 |
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,579,618 A | 4/1986 | Celestino et al. | 156/345 |
| 4,584,026 A | 4/1986 | Wu et al. | 148/1.5 |
| 4,698,104 A | 10/1987 | Barker et al. | 427/141 |
| 4,764,394 A | 8/1988 | Conrad | 427/38 |
| 4,778,561 A | 10/1988 | Ghanbari | 156/643 |
| 4,837,172 A | 6/1989 | Mizuno et al. | 438/475 |
| 4,867,859 A | 9/1989 | Harada et al. | 304/298 |
| 4,871,421 A | 10/1989 | Ogle et al. | 156/643 |
| 4,892,753 A | 1/1990 | Wong et al. | 427/38 |
| 4,912,065 A | 3/1990 | Mizuno et al. | 437/141 |
| 4,937,205 A | 6/1990 | Nakayama et al. | 437/165 |
| 4,948,458 A | 8/1990 | Ogle | 156/643 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,229,305 A | 7/1993 | Baker | 437/11 |
| 5,270,250 A | 12/1993 | Murai et al. | 437/165 |
| 5,277,751 A | 1/1994 | Ogle | 156/643 |
| 5,288,650 A | 2/1994 | Sandow | 437/24 |
| 5,290,382 A | 3/1994 | Zarowin et al. | 156/345 |
| 5,312,778 A | 5/1994 | Collins et al. | 437/225 |
| 5,354,381 A | 10/1994 | Sheng | 118/723 |
| 5,435,881 A | 7/1995 | Ogle | 156/345 |
| 5,505,780 A | 4/1996 | Dalvie et al. | 118/723 |
| 5,510,011 A | 4/1996 | Okamura et al. | 204/192.3 |
| 5,514,603 A | 5/1996 | Sato | 437/16 |
| 5,520,209 A | 5/1996 | Goins et al. | 137/246 |
| 5,542,559 A | 8/1996 | Kawakami et al. | 216/67 |
| 5,561,072 A | 10/1996 | Saito | 437/24 |
| 5,569,363 A | 10/1996 | Bayer et al. | 204/192.32 |
| 5,572,038 A | 11/1996 | Sheng et al. | 250/492.21 |
| 5,587,038 A | 12/1996 | Cecchi et al. | 156/345 |
| 5,627,435 A | 5/1997 | Jansen et al. | 315/111.21 |
| 5,643,838 A | 7/1997 | Dean et al. | 437/238 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 165/429 |
| 5,770,982 A | 6/1998 | Moore | 333/32 |
| 5,885,358 A | 3/1999 | Maydan et al. | 118/723 |
| 5,888,413 A | 3/1999 | Okumura et al. | 216/68 |
| 5,897,713 A | 4/1999 | Tomioka et al. | 118/723 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,958,140 A | 9/1999 | Arami et al. | 118/725 |
| 5,985,742 A | 11/1999 | Henley et al. | 438/515 |
| 5,994,207 A | 11/1999 | Henley et al. | 438/515 |
| 5,994,236 A | 11/1999 | Ogle | 48/728 |
| 5,998,933 A | 12/1999 | Shun'Ko | 315/11.51 |
| 6,000,360 A | 12/1999 | Koshimizu | 118/723 |
| 6,013,567 A | 1/2000 | Henley et al. | 438/515 |
| 6,020,592 A | 2/2000 | Liebert et al. | 250/492.21 |
| 6,041,735 A | 3/2000 | Murzin et al. | 118/723 |
| 6,050,218 A | 4/2000 | Chen et al. | 118/723 |
| 6,076,483 A | 6/2000 | Shintani et al. | 118/723 |
| 6,083,324 A | 7/2000 | Henley et al. | 148/33.2 |
| 6,096,661 A | 8/2000 | Ngo et al. | 438/788 |
| 6,101,971 A | 8/2000 | Denholm et al. | 118/723 E |
| 6,103,599 A | 8/2000 | Henley et al. | 438/459 |
| 6,121,161 A | 9/2000 | Rossman et al. | 438/783 |
| 6,132,552 A | 10/2000 | Donohoe et al. | 156/345 |
| 6,139,697 A | 10/2000 | Chen et al. | 204/192.15 |
| 6,150,628 A | 11/2000 | Smith et al. | 219/121.54 |
| 6,153,524 A | 11/2000 | Henley et al. | 438/691 |
| 6,155,090 A | 12/2000 | Rubensson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,180,496 B1 | 1/2001 | Farrens et al. | 438/455 |
| 6,182,604 B1 | 2/2001 | Goeckner et al. | 118/723 |
| 6,187,110 B1 | 2/2001 | Henley et al. | 148/33.2 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Dolan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Nishida | 438/407 |
| 6,300,643 B1 | 10/2001 | Fang et al. | 250/492.21 |
| 6,303,519 B1 | 10/2001 | Hsiao | 438/758 |
| 6,305,316 B1 | 10/2001 | DiVergilio et al. | 118/723 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,344,404 B1 | 2/2002 | Cheung et al. | 438/513 |
| 6,348,126 B1 | 2/2002 | Hanawa et al. | 156/345 |
| 6,375,790 B1 * | 4/2002 | Fenner | 156/345.28 |
| 6,387,719 B1 | 5/2002 | Mrvos et al. | 438/21 |
| 6,392,351 B1 | 5/2002 | Shun'Ko | 315/111.51 |
| 6,395,150 B1 | 5/2002 | Can Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,432,260 B1 | 8/2002 | Mahoney et al. | 156/345.35 |
| 6,433,553 B1 | 8/2002 | Goeckner et al. | 324/464 |
| 6,453,842 B1 | 9/2002 | Hanawa et al. | 118/723 |
| 6,461,933 B2 | 10/2002 | Houston | 438/423 |
| 6,468,388 B1 | 10/2002 | Hanawa et al. | 156/345.48 |
| 6,492,612 B1 | 12/2002 | Taguchi et al. | 219/121.43 |
| 6,494,986 B1 | 12/2002 | Hanawa et al. | 156/345.35 |
| 6,511,899 B1 | 1/2003 | Henley et al. | 438/515 |
| 6,513,538 B2 | 2/2003 | Chung et al. | 134/1.2 |
| 6,514,838 B2 | 2/2003 | Chan | 438/513 |
| 6,528,391 B1 | 3/2003 | Henley et al. | 438/459 |
| 6,551,446 B1 | 4/2003 | Hanawa et al. | 156/345.48 |
| 6,559,408 B2 | 5/2003 | Smith et al. | 219/121.57 |
| 6,582,999 B2 | 6/2003 | Henley et al. | 438/221 |
| 6,593,173 B1 | 7/2003 | Anc et al. | 438/149 |
| 6,632,324 B2 | 10/2003 | Chan | 156/345.48 |
| 6,643,557 B1 | 11/2003 | Miller et al. | 700/110 |
| 6,645,828 B1 | 11/2003 | Farrens et al. | 438/455 |
| 6,679,981 B1 | 1/2004 | Pan et al. | 204/298.06 |
| 6,747,243 B1 * | 6/2004 | Reinhardt | 219/121.69 |
| 6,780,759 B2 | 8/2004 | Farrens et al. | 438/635 |
| 6,811,448 B1 | 11/2004 | Paton et al. | 439/706 |
| 6,838,695 B2 | 1/2005 | Doris et al. | 257/55 |

| | | | | | | |
|---|---|---|---|---|---|---|
| 6,887,341 | B2 | 5/2005 | Strang et al. ............ 156/345.48 | JP | 59-86214 | 5/1984 |
| 2001/0017109 | A1 | 8/2001 | Liu et al. ............... 118/723.001 | JP | 59-218728 | 12/1984 |
| 2001/0042827 | A1 | 11/2001 | Fang et al. | JP | 62-120041 | 6/1987 |
| 2002/0047543 | A1 | 4/2002 | Sugai et al. ............. 315/111.21 | JP | 62290885 A | 12/1987 |
| 2003/0013260 | A1 | 1/2003 | Gossman et al. ............ 438/301 | JP | 04318168 A | 9/1992 |
| 2003/0029567 | A1 | 2/2003 | Dhindsa et al. ......... 156/345.47 | JP | 070455542 | 2/1995 |
| 2003/0085205 | A1 | 5/2003 | Lai et al. ................ 219/121.43 | JP | 07130496 A | 5/1995 |
| 2003/0211705 | A1 | 11/2003 | Tong et al. .................. 438/455 | JP | 09186337 A | 7/1997 |
| 2004/0036038 | A1 | 2/2004 | Okumura et al. ......... 250/492.2 | JP | 2000150908 | 5/2000 |
| 2004/0092084 | A1 | 5/2004 | Rayssac ...................... 438/455 | WO | WO 99/00832 | 1/1999 |
| 2004/0126993 | A1 | 7/2004 | Chan et al. .................. 438/455 | WO | WO 01/11650 A1 | 2/2001 |
| | | | | WO | WO 02/25694 A2 | 3/2002 |
| | | | | WO | WO 93/18201 | 9/2003 |

FOREIGN PATENT DOCUMENTS

| | | |
|---|---|---|
| EP | 0 836 218 A2 | 4/1998 |
| EP | 0 964 074 A2 | 12/1999 |
| EP | 1 054 433 A1 | 11/2000 |
| EP | 1 111 084 A1 | 6/2001 |
| EP | 1 158 071 A2 | 11/2001 |
| EP | 1 191 121 A1 | 3/2002 |

OTHER PUBLICATIONS

Wolf, Stanley and Taubner, Richard, "Silicon Processing for the VLSI Era", 2000, Lattice Press, vol. 1, pp. 303-308.

* cited by examiner

SILICON-ON-INSULATOR WAFER TRANSFER METHOD USING SURFACE ACTIVATION PLASMA IMMERSION ION IMPLANTATION FOR WAFER-TO-WAFER ADHESION ENHANCEMENT

CROSS-REFERENCE TO RELATED APPLICATIONS

This application is a continuation-in-part of U.S. application Ser. No. 10/838,052 filed May 3, 2004 entitled VERY LOW TEMPERATURE CVD PROCESS WITH CONFORMALITY, STRESS AND COMPOSITION OF THE CVD LAYER by Hiroji Hanawa, et al. (the disclosure of which is incorporated herein by reference), which is a continuation-in-part of U.S. application Ser. No. 10/786,410 filed Feb. 24, 2004 now U.S. Pat. No. 6,893,970 entitled FABRICATION OF SILICON-ON-INSULATOR STRUCTURE USING PLASMA IMMERSION ION IMPLANTATION by Daniel Maydan, et al., which is a continuation-in-part of U.S. application Ser. No. 10/646,533 filed Aug. 22, 2003 entitled PLASMA IMMERSION ION IMPLANTATION PROCESS USING A PLASMA SOURCE HAVING LOW DISSOCIATION AND LOW MINIMUM PLASMA VOLTAGE by Kenneth Collins, et al., which is a continuation-in-part of U.S. application Ser. No. 10/164,327 filed Jun. 5, 2003 now U.S. Pat. No. 6,939,434 entitled EXTERNALLY EXCITED TORROIDAL PLASMA SOURCE WITH MAGNETIC CONTROL OF ION DISTRIBUTION by Kenneth Collins, et al., which is a continuation-in-part of U.S. application Ser. No. 09/636,435 filed Aug. 11, 2000 now U.S. Pat. No. 6,694,986 entitled EXTERNALLY EXCITED MULTIPLE TORROIDAL PLASMA SOURCE by Hiroji Hanawa, et al., now issued as U.S. Pat. No. 6,494,986 B1, all of which are assigned to the present assignee.

This application also contains subject matter related to U.S. application Ser. No. 10/646,458, filed Aug. 22, 2003, entitled PLASMA IMMERSION ION IMPLANTATION APPARATUS INCLUDING A PLASMA SOURCE HAVING LOW DISSOCIATION AND LOW MINIMUM PLASMA VOLTAGE, by Kenneth Collins, et al.; U.S. application Ser. No. 10/646,532, filed Aug. 22, 2003, entitled PLASMA IMMERSION ION IMPLANTATION APPARATUS INCLUDING A CAPACITIVELY COUPLED RF PLASMA SOURCE HAVING LOW DISSOCIATION AND LOW MINIMUM PLASMA VOLTAGE, by Kenneth Collins, et al.; U.S. application Ser. No. 10/646,612, filed Aug. 22, 2003, entitled PLASMA IMMERSION ION IMPLANTATION PROCESS USING A CAPACITIVELY COUPLED PLASMA SOURCE HAVING LOW DISSOCIATION AND LOW MINIMUM PLASMA VOLTAGE, by Kenneth Collins, et al.; U.S. application Ser. No. 10/646,528, filed Aug. 22, 2003, entitled PLASMA IMMERSION ION IMPLANTATION PROCESS USING A PLASMA SOURCE HAVING LOW DISSOCIATION AND LOW MINIMUM PLASMA VOLTAGE, by Kenneth Collins, et al.; U.S. application Ser. No. 10/646,467, filed Aug. 22, 2003, entitled PLASMA IMMERSION ION IMPLANTATION PROCESS USING AN INDUCTIVELY COUPLED PLASMA SOURCE HAVING LOW DISSOCIATION AND LOW MINIMUM PLASMA VOLTAGE, by Kenneth Collins, et al.; U.S. application Ser. No. 10/646,527, filed Aug. 22, 2003, entitled PLASMA IMMERSION ION IMPLANTATION SYSTEM INCLUDING A PLASMA SOURCE HAVING LOW DISSOCIATION AND LOW MINIMUM PLASMA VOLTAGE, by Kenneth Collins, et al.; U.S. application Ser. No. 10/646,526, filed Aug. 22, 2003, entitled PLASMA IMMERSION ION IMPLANTATION SYSTEM INCLUDING AN CAPACITIVELY COUPLED PLASMA SOURCE HAVING LOW DISSOCIATION AND LOW MINIMUM PLASMA VOLTAGE, by Kenneth Collins, et al.; and U.S. application Ser. No. 10/646,460, filed Aug. 22, 2003, entitled PLASMA IMMERSION ION IMPLANTATION SYSTEM INCLUDING AN INDUCTIVELY COUPLED PLASMA SOURCE HAVING LOS DISSOCIATION AND LOW MINIMUM PLASMA VOLTAGE, by Kenneth Collins, et al., all of which are assigned to the present assignee.

BACKGROUND OF THE INVENTION

Semiconductor circuit fabrication is evolving to meet ever increasing demands for higher switching speeds and lower power consumption. For applications requiring large computational power, there is a need for higher device switching speeds at a given power level. For mobile applications, there is a need for lower power consumption levels at a given switching speed. Increased device switching speeds are attained by reducing the junction capacitance. Reduced power consumption is attained by reducing parasitic leakage current from each device to the substrate. Both reduced junction capacitance and reduced parasitic leakage current is attained by forming devices on multiple silicon islands formed on an insulating (silicon dioxide) layer on the semiconductor substrate, each island being electrically insulated from all other islands by the silicon dioxide layer. Such a structure is called a silicon-on-insulator (SOI) structure.

SOI structures may be formed in a layer transfer process in which a crystalline silicon wafer is bonded to the top of a silicon dioxide layer previously formed on another crystalline silicon wafer. Van der Wals forces cause the two wafers to adhere immediately, allowing a stronger bond to be formed thereafter by heating the conjoined wafers in an anneal step. The "top" wafer forming the active semiconductor layer is then cleaved along a plane and the upper portion removed to provide a suitably thin active semiconductor layer thickness.

While such SOI structures provide the desired increase in device speed and/or decrease in power consumption, they are susceptible to failure by separation at the interface where the two wafers are conjoined. This is because the silicon-to-silicon dioxide atomic bonds between the two wafers are or can be imperfect, in that they are not identical to (not as dense as) the ideal silicon-to-silicon dioxide bonds between a silicon wafer and the silicon dioxide layer formed on that wafer by a thermal process. The chief reason for this is that the proportion of atomic sites at each wafer surface available for bonding between the two wafers is less than in the case of the ideal example of a thermal oxide layer formed on a silicon substrate.

The problem of the tendency of SOI structures to failure by separation has thus far rendered SOI structures less useful than had been anticipated, so that the need for higher device speed and lower power consumption has not been fully met.

Another cause of the cleavage or separation problem is the susceptibility of the wafer-to-wafer bond to failure in the presence of contamination on the surface of either wafer prior to wafer-to-wafer bonding. Thus, the SOI fabrication process is highly sensitive to contamination and is relatively unreliable as a result.

Another problem that must be addressed in SOI fabrication is the amending of the cleaved surface of the top active silicon layer to form a high quality smooth crystalline surface that is at least nearly as good as the surface of a crystalline silicon wafer. This is important because charge mobility of devices formed in the active layer depend upon the crystalline quality of the surface of the active layer. Currently, this need is addressed by chemical mechanical polishing of the cleaved surface of the active layer. The problem is that chemical mechanical polishing can leave imperfections in the surface and must be carried out in a separate apparatus, is relatively slow, and therefore represents a significant cost factor in the SOI fabrication process.

A further problem of the SOI fabrication process is that the cleavage of the "top" silicon layer along a true plane to form a thin active layer requires implantation of ions along an entire plane defining the cleavage plane at some predetermined uniform depth below the surface. With conventional ion implantation techniques, a thin ion beam must be rastered across the entire area of the wafer until the entire cleavage plane has received a uniform predetermined ion dose (number of ions per unit area of the cleavage plane). This is a problem because the ion implantation step requires an inordinate amount of time (on the order of hours for a 300 mm wafer, for example), and therefore represents a further significant cost factor. As a result of this and other factors, SOI fabrication costs are so excessive relative to conventional semiconductor circuit structures, that they are not competitive except where the need for high speed or low power consumption is overwhelming. As a result, SOI structures currently find very limited use.

What is needed, therefore, is a solution to the problem of an inherently weak or non-ideal bond between the conjoined wafers, the pronounced susceptibility of the SOI process to contamination, the required use of a chemical mechanical polishing step in the SOI fabrication process, and the costly ion implantation step for forming the cleavage plane of the active layer.

SUMMARY OF THE INVENTION

A method of fabricating a semiconductor-on-insulator structure from a pair of semiconductor wafers, includes forming an oxide layer on at least a first surface of a first one of the wafers The method further includes performing a cleavage ion implantation step on one of the pair of wafers by ion implanting a specie to define a cleavage plane across a diameter of the wafer at the predetermined depth below the top surface of the one wafer and performing a bonding enhancement implantation step by ion implantation of a first species in the first surface of at least either of the pair of wafers. The wafers are then bonded together by placing the first surfaces of the pair of wafers onto one another so as to form an semiconductor-on-insulator structure. The method also includes separating the one wafer along the cleavage plane so as to remove a portion of the one wafer between the second surface and the cleavage plane, whereby to form an exposed cleaved surface of a remaining portion of the one wafer on the semiconductor-on-insulator structure. Finally, the cleaved surface is smoothed, preferably by carrying out a low energy ion implantation step.

Each of the foregoing ion implantation steps can be carried out by plasma immersion ion implantation of the first species using a torroidal source. This is accomplished by placing either or both of the pair of wafers in a process zone, introducing a first process gas containing a precursor of the species to be implanted, and then generating a first oscillating plasma current from the process gas in a closed torroidal path extending through a reentrant conduit external of the process zone and through the process zone. Ions from the plasma current are accelerated toward the wafer surface by bias power coupled to the wafer that determines the implantation depth profile.

DETAILED DESCRIPTION OF THE INVENTION

Figure 1A:
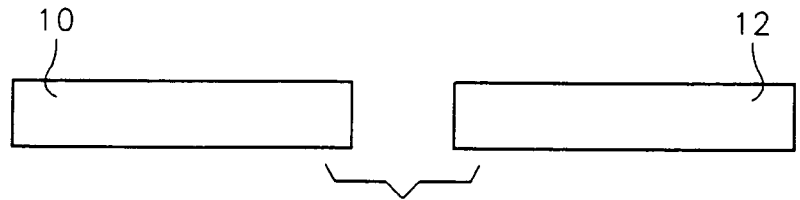
FIGS. 1A through 1H illustrate a sequence of steps in an SOI fabrication process in accordance with a first aspect.
Figure 1B:
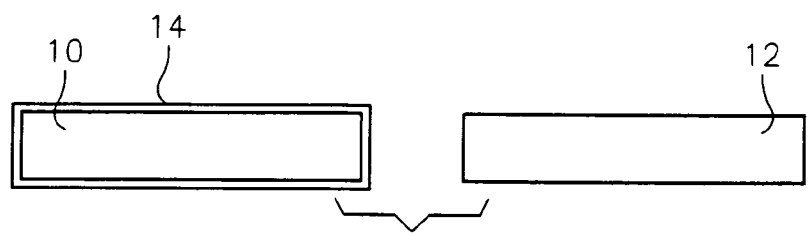
Figure 1C:
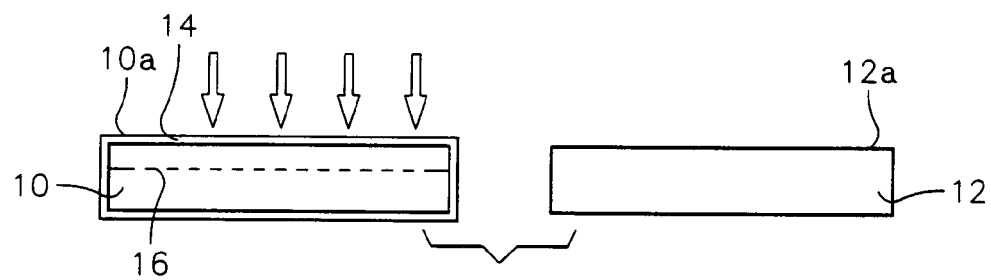

FIGS. 1A through 1H illustrate a sequence of steps in a wafer transfer SOI fabrication process in accordance with a first embodiment of the invention. FIGS. 2A and 2B illustrate the type of torroidal source plasma immersion ion implantation reactor that can be employed in carrying out some of the steps of the SOI fabrication process of FIGS. 1A through 1H. In FIG. 1A, a pair of wafers 10, 12 are provided. The wafers 10, 12 may be identical silicon crystalline wafers of the type employed in the manufacture of semiconductor microelectronic circuits. As one example, the wafers 10, 12 may be formed of intrinsic crystalline silicon and sliced to a thickness of about 2 mm from a cylindrical 300 mm diameter silicon boule along the silicon crystal 110 plane.

Their surfaces may be polished to a micron smoothness. In the step of FIG. 1B, the wafer 10 is subjected to a thermal oxidation process to form a silicon dioxide film 14 on the top and back sides of the wafer 10. The thickness of the oxide film 14 may be in a range of about 1500 Angstroms to 2000 Angstroms. In FIG. 1C, a high energy cleavage ion implantation step is performed in which an ion species, such as hydrogen, is implanted at a uniform depth below the active surface 10a of the wafer 10 to define a cleavage plane 16 within the wafer 10. Within the cleavage plane 16, this ion implantation step creates damaged atomic bonds in the silicon crystal lattice, rendering the wafer susceptible to separation along the cleavage plane 16, as will be exploited later in the fabrication sequence described here. The cleavage plane preferably is about 4000 Angstroms below the top surface 10a or about 2000 Angstroms below the silicon dioxide film 14. The cleavage implantation step of FIG. 1C is preferably performed by plasma immersion ion implantation in order to reduce the time required to perform this step. This step may therefore be performed using the torroidal source plasma ion immersion implantation reactor of FIGS. 2A AND 2B.

Figure 1D:
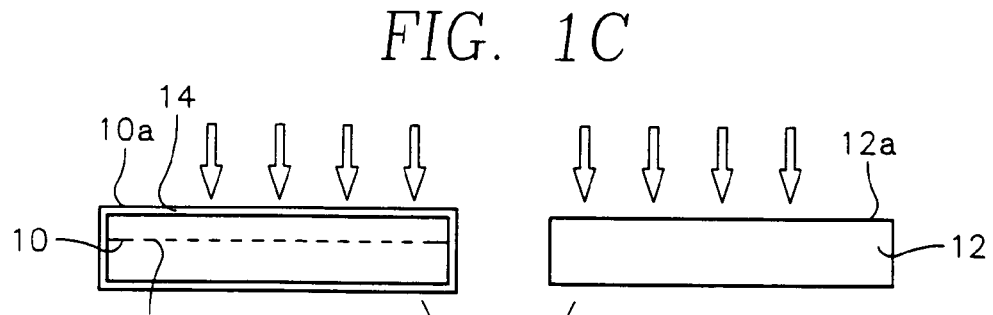
Figure 2A:
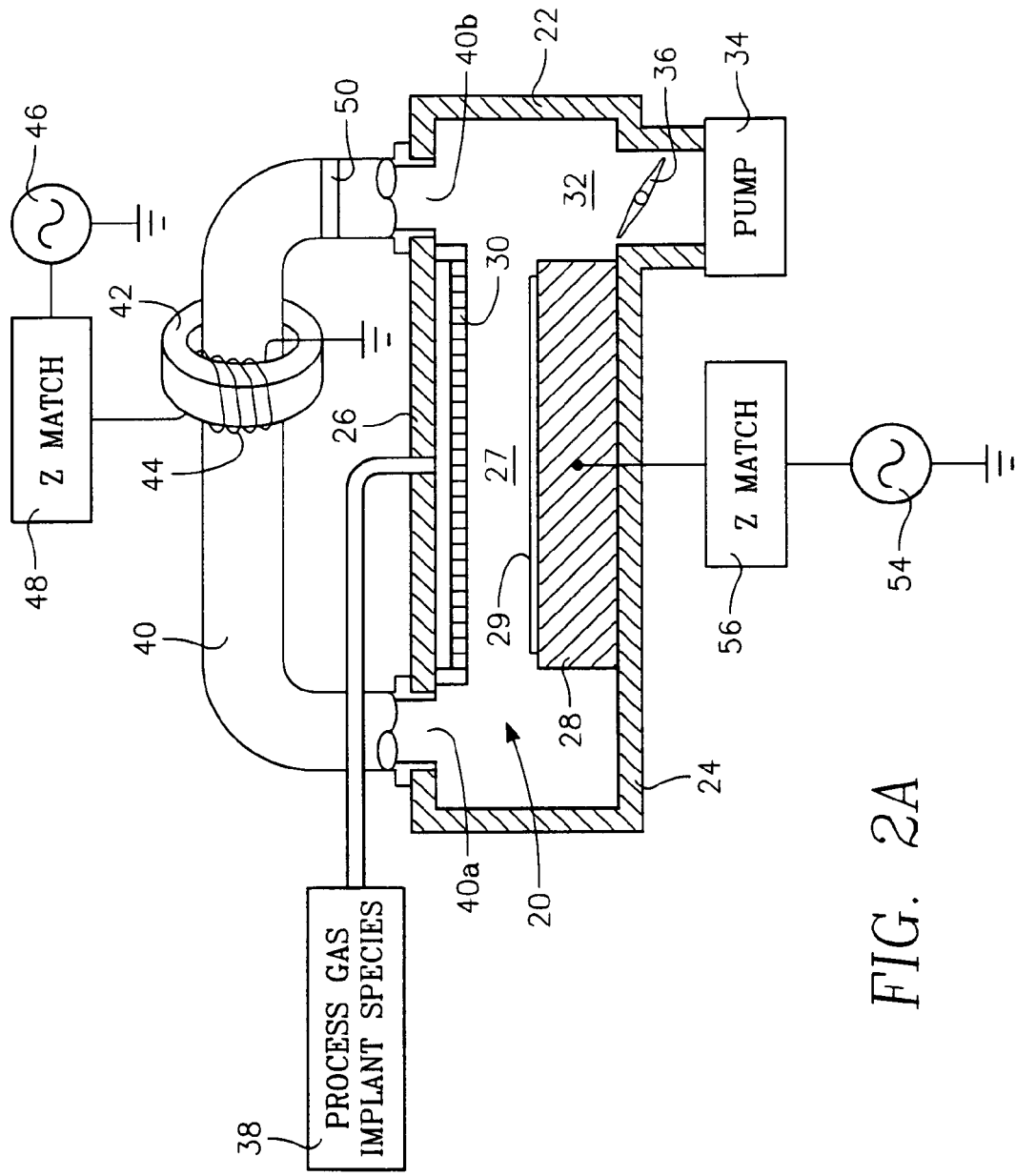
FIGS. 2A and 2B illustrate a torroidal source plasma immersion ion implantation reactor that can be employed in carrying out the process of FIG. 1.
Figure 2B:
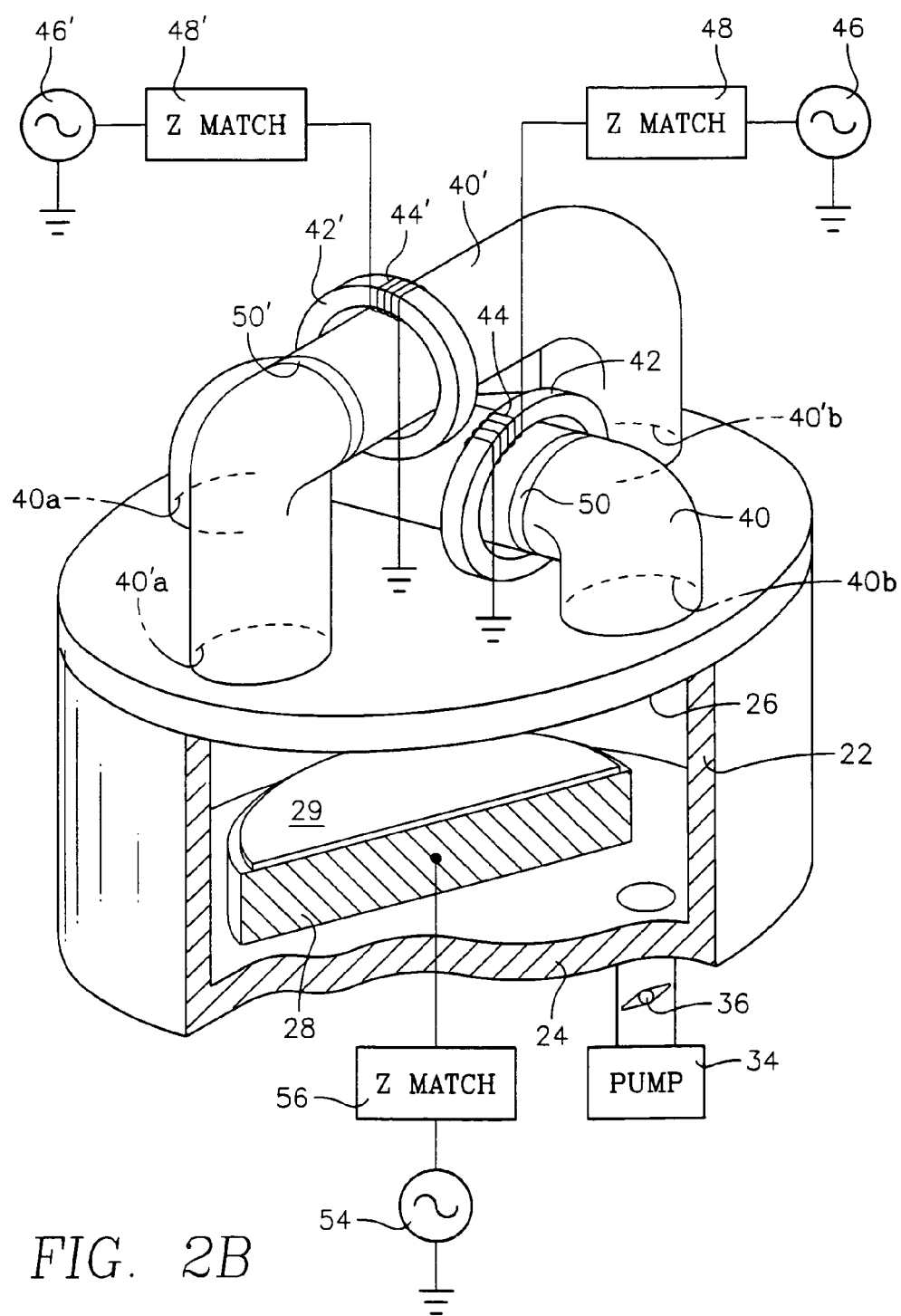

In the step of FIG. 1D, a surface activation ion implantation step is performed on the top or active surfaces 10a, 12a of both wafers 10, 12 (or at least one of the wafers 10, 12). Each wafer 10, 12 are typically implanted at separate times in successive implantation steps and in the apparatus or simultaneously in different apparatus. The implantation step of FIG. 1D is carried out at a sufficiently low ion energy so that the implanted ion profile is concentrated (is maximum) at the top surface 10a, 12a of each wafer 10, 12 (or one of the wafers 10, or 12 if only one wafer is treated in this step). For this reason, it is preferred to carry out the step of FIG. 1C in a torroidal source plasma immersion ion implantation reactor of the type illustrated in FIGS. 2A and 2B. One advantage of such a choice is that the torroidal source plasma immersion ion implantation reactor of FIGS. 2A and 2B provides a very low minimum ion energy, which better enables the concentration of implanted ions at the wafer top surfaces 10a, 12a. Another advantage is that the ion implantation step is performed very quickly relative to the time required using a conventional ion beam implantation apparatus. The torroidal source plasma immersion ion implantation reactor of FIGS. 2A and 2B will be described below in this specification.

The ion implantation step of FIG. 1D may implant oxygen, nitrogen, hydrogen, argon or xenon ions, although oxygen may be preferred. The ion energy is selected to realize an implanted ion distribution profile that has its peak at or at least within 100 Angstroms of the surface (10a, 12a) of the wafer. The main advantage of this ion implantation step is that more atomic sites in the crystal lattice of each surface (i.e., the silicon dioxide active surface 10a and/or the silicon active surface 12a) are available for bonding with atomic sites in the other surface when they are pressed together in a later step discussed below.

Figure 1E:
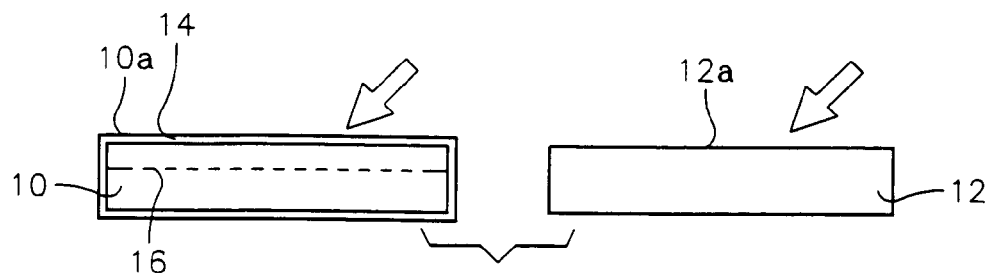

In FIG. 1E, a laser defect ablation process is performed using commercially available apparatus. In this step, defects such as particulate contamination on the active surface 10a, 12a of each wafer are precisely located in the plane of the surface using optical detection, and a laser beam is directed to the precise location of each detected defect so as to ablate (remove) the defect with the power of the laser beam. The result is that the active wafer surfaces 10a, 12a become free of defects such as particulate contamination.

Figure 1F:
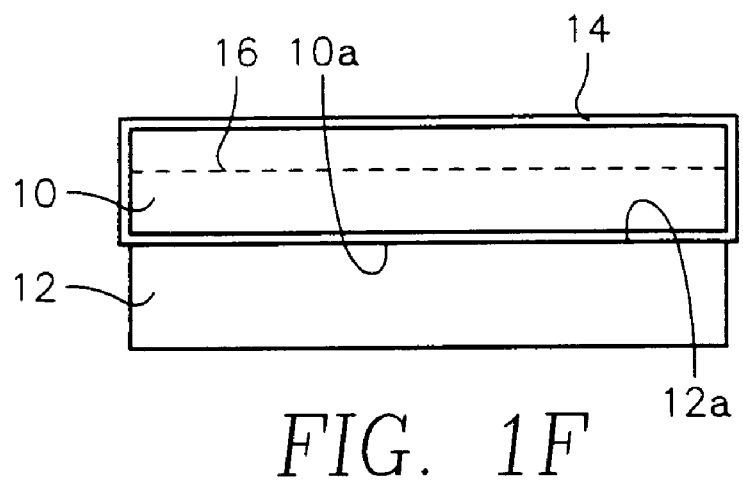

In FIG. 1F, the active surfaces 10a, 12a of the wafers 10, 12 are abutted together. Van der Wals forces cause the two wafers 10, 12 to adhere. In this step, the adhesion between the wafers is increased by heating them to a relatively high temperature (e.g., 1000 degrees C.), causing the Van der Wals forces to be replaced by atomic bonds formed between facing lattice sites in the two active surfaces 10a, 12a. A far greater proportion of the lattice atomic sites in each surface 10a, 12a are available for electronic bonding with lattice sites in the other surface because the activation ion implant step of FIG. 1D opened some lattice sites in the surface to make them available to form covalent bonds with lattice sites in the other surface. As a result, the bonding force between the two wafers 10, 12 is about twice as great as it would have been without the activation implant step of FIG. 1D.

Figure 1G:
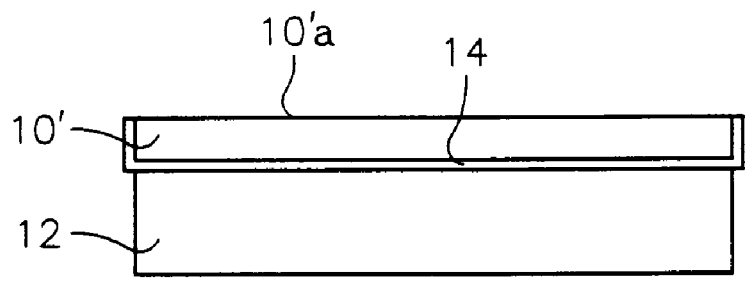

In FIG. 1G, the wafer 10 is separated along the cleavage plane 16, leaving a thin portion 10' of the wafer 10 bonded to the wafer 12. The thin portion 10' is the active silicon layer in which semiconductor devices including PN junctions are to be fabricated.

Figure 1H:
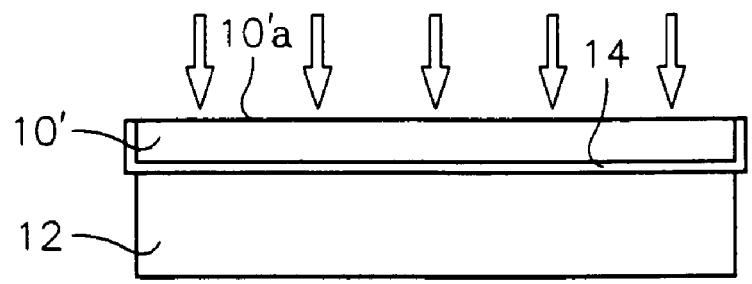

The active layer top surface 10'a (which coincides with the cleavage plane of FIG. 1F) is now rough and somewhat amorphous due to the separation or breakage along the cleavage plane 16, and due to ion bombardment damage that occurred during the cleavage ion implantation step of FIG. 1C. In order to smooth and re-crystallize the active layer surface 10'a, a surface smoothing implant step is carried out as shown in FIG. 1H. This is accomplished by implanting ions at low energy and relatively high momentum, using low energy heavy ions, for example. Such ions may be a heavy species such as Xenon or Argon, for example, although other (lighter) species may be used in some cases. The low ion energy renders the ion implant profile more shallow and therefore concentrated at the surface where most of the lattice repair and surface smoothing must be performed. The high momentum provides more effective interaction between the incident ions and the lattice. The surface smoothing low energy high momentum implantation step of FIG. 1H is preferably performed by plasma immersion ion implantation in order to reduce the time required to perform this step. This step may therefore be performed using the torroidal source plasma ion immersion implantation reactor of FIGS. 2A and 2B. An advantage of using the reactor of FIGS. 2A and 2B for the low energy implant step of FIG. 1H is that this reactor has a minimum ion energy that is lower and better controlled than other reactors.

Referring to FIG. 2A, the torroidal source plasma immersion ion implantation reactor consists of a vacuum chamber 20 defined by a cylindrical side wall 22, a bottom 24 and a ceiling 26. A plasma processing region 27 is defined between a wafer support pedestal 28 for supporting a semiconductor wafer 29 and the ceiling 26. The ceiling 26 includes a gas distribution plate 30 facing the wafer support pedestal 28. A pumping annulus 32 is defined between the wafer support pedestal 28 and the side wall 22. A vacuum pump 34 is coupled through a throttle valve 36 to the pumping annulus 32. A process gas supply 38 is coupled to the gas distribution plate 30, and contains gaseous precursor compounds of the species to be ion implanted in the wafer 29.

The reactor of FIG. 2A further includes a torroidal plasma source best shown in the perspective view of FIG. 2B. The torroidal plasma source includes a pair of separate external reentrant conduits 40, 40' outside of the vacuum chamber 20 disposed transverse to one another (or orthogonal to one another in the illustrated embodiment) and being unconnected to one another. The external conduit 40 has one end 40a coupled through opening into the chamber (e.g., through the ceiling 26 in the illustrated embodiment) at one side of the process region 27 and its other end 40b opening into the chamber at an opposite side of the process region 27. The other external conduit 40' has one end 40'a coupled through opening into the chamber (e.g., through the ceiling 26 in the illustrated embodiment) at one side of the process region 27 and its other end 40'b opening into the chamber at an opposite side of the process region 27. Because the two conduits 40, 40' are orthogonal to one another in the illustrated embodiment, their ends 40a, 40b, 40'a, 40'b are disposed at 90 degree intervals around the periphery of the ceiling 26. However, the pair of conduits need not necessarily be orthogonal to one another so that the distribution of the conduit ends 40a, 40b, 40'a, 40'b could be different from that illustrated in FIG. 2B.

Magnetically permeable torroidal cores 42, 42' surround a portion of a corresponding one of the reentrant conduits 40, 40'. Conductive coils 44, 44' wound around a portion of the respective core 42, 42' are coupled to respective RF plasma source power generators 46, 46' through respective impedance match circuits or elements 48, 48'. Each reentrant conduit 40, 40' is a hollow conductive tube interrupted by an insulating annular ring 50, 50', respectively, that interrupts an otherwise continuous electrical path between the two ends 40a, 40b (and 40'a, 40'b) of the respective reentrant conduit 40, 40'. Ion energy at the wafer surface is controlled by an RF plasma bias power generator 54 coupled to the wafer support pedestal 28 through an impedance match circuit or element 56.

Process gas consisting of gaseous compound(s) of the species to be implanted in the wafer 29 are introduced through the overhead gas distribution plate 30 into the process region 27, from whence it flows into the external reentrant conduit 40. RF plasma source power is coupled from the power applicator 42, 44 to the gases in the conduit 40, which creates a circulating plasma current in a first closed torroidal path including the reentrant conduit 40 and the process region 27. Likewise, RF plasma source power is coupled from the other power applicator 42', 44' to the gases in the other conduit 40', which creates a circulating plasma current in a second closed torroidal path transverse (e.g., orthogonal) to the first torroidal path. The second torroidal path includes the reentrant other conduit 40' and the process region 27. The plasma currents in each of the paths oscillate (reverses direction) at the frequencies of the respective RF power generator 46, 46', which may be the same or slightly offset from one another. The power of each plasma source power generator 46, 46' is set to a level at which their combined effect produces a desired ion flux at the surface of the wafer 29. The power of the RF plasma bias power generator 54 is set to a level at which the ion energy at the wafer surface corresponds to a desired ion implantation profile or depth below the top surface of the wafer 29.

Oscillating torroidal plasma currents of the type produced in the reactor of FIGS. 2A and 2B are employed to carry out the low energy surface activation ion implantation step of FIG. 1D, the high energy cleavage implant step of FIG. 1C and the low energy high momentum surface smoothing ion implantation step of FIG. 1H. How these ion implantation steps are carried out with reactors of the type illustrated in FIGS. 2A and 2B will be discussed below.

The order in which certain steps in the SOI fabrication process of FIG. 1 may be changed. Specifically, the surface activation ion implantation step (FIG. 1D) may be carried out after the cleavage implant step (FIG. 1C), as in the sequence of FIGS. 1A through 1H. Alternatively, the surface activation ion implantation step may be carried out before the cleavage implant step.

Furthermore, while the oxidized wafer 10 is the one that is cleaved in the SOI fabrication process sequence of FIGS. 1A through 1H, in an alternative embodiment the unoxidized wafer 12 may be cleaved instead. This alternative embodiment is illustrated by the SOI fabrication process sequence of FIGS. 3A through 3H. The steps of FIGS. 3A through 3H are identical with the steps of FIGS. 1A through 1H, respectively, with the exception that in the steps of FIGS. 1C and 1G, it is the oxidized wafer 10 that receives the cleavage implant (FIG. 1D) and is cleaved (FIG. 1G), while in FIGS. 3C and 3G, it is the unoxidized wafer 12 that receives the cleavage implant (FIG. 3C) and is cleaved (FIG. 3G). The advantage of the embodiment of FIGS. 3A through 3H is that the implantation depth is only 2000 Angstroms (half the depth of the embodiment of FIGS. 1A through 1H), so that the ion energy is reduced approximately by a factor of two.

Figure 3A:
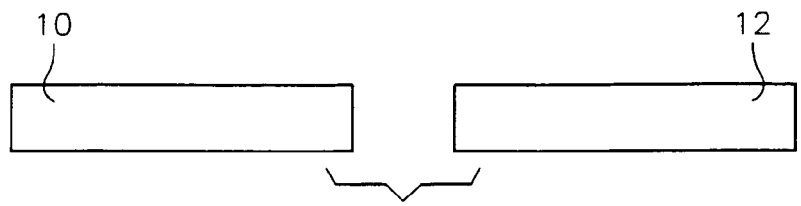
FIGS. 3A through 3H illustrate a sequence of steps in an SOI fabrication process in accordance with a second aspect.
Figure 3B:
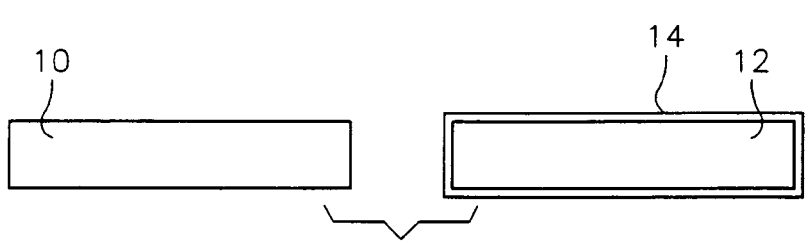
Figure 3C:
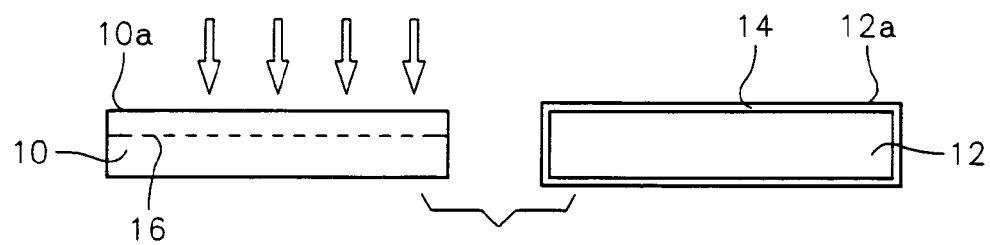
Figure 3D:
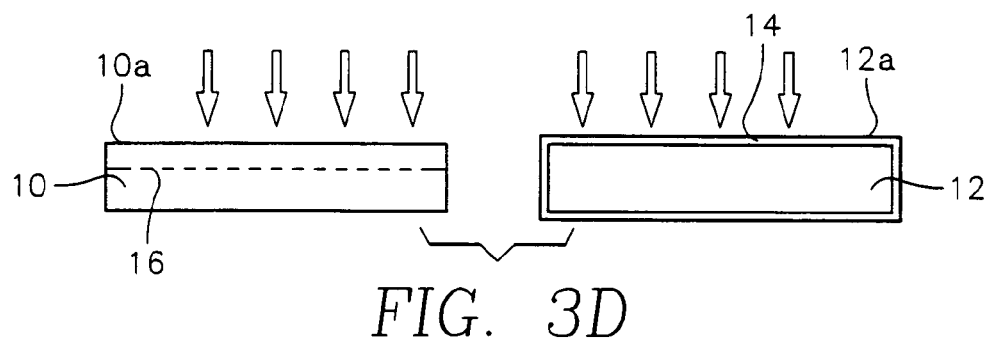
Figure 3E:
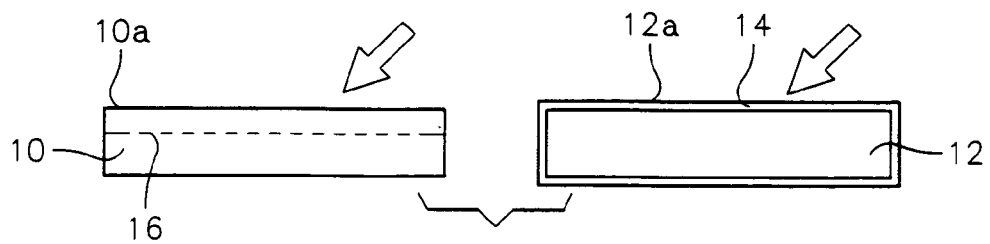
Figure 3F:
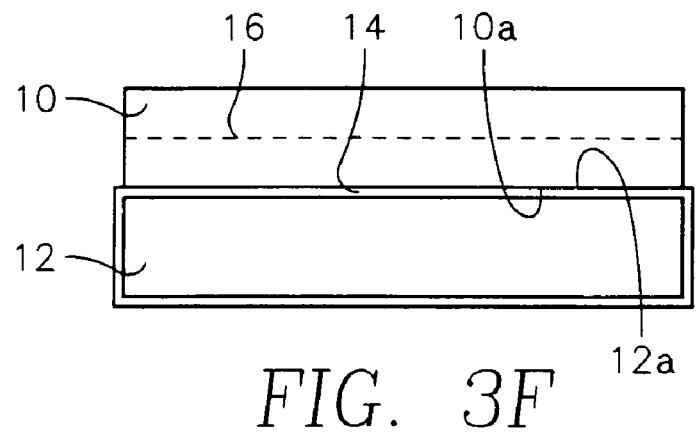
Figure 3G:
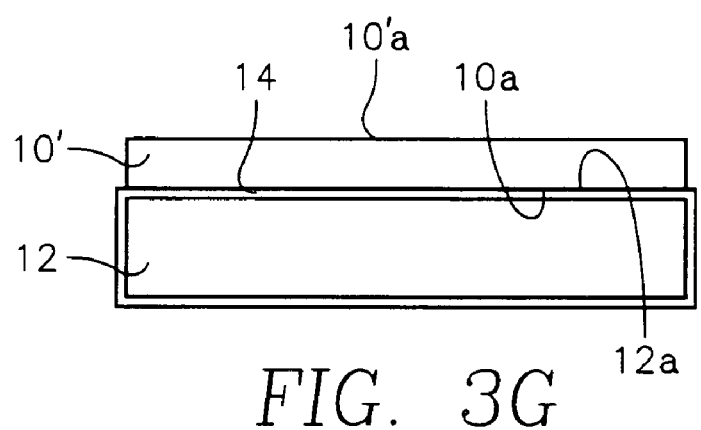
Figure 3H:
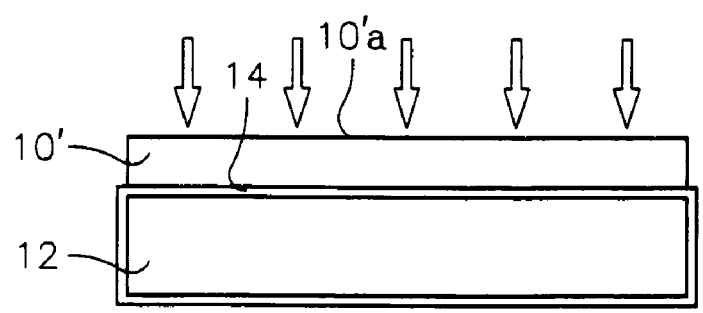
Figure 4:
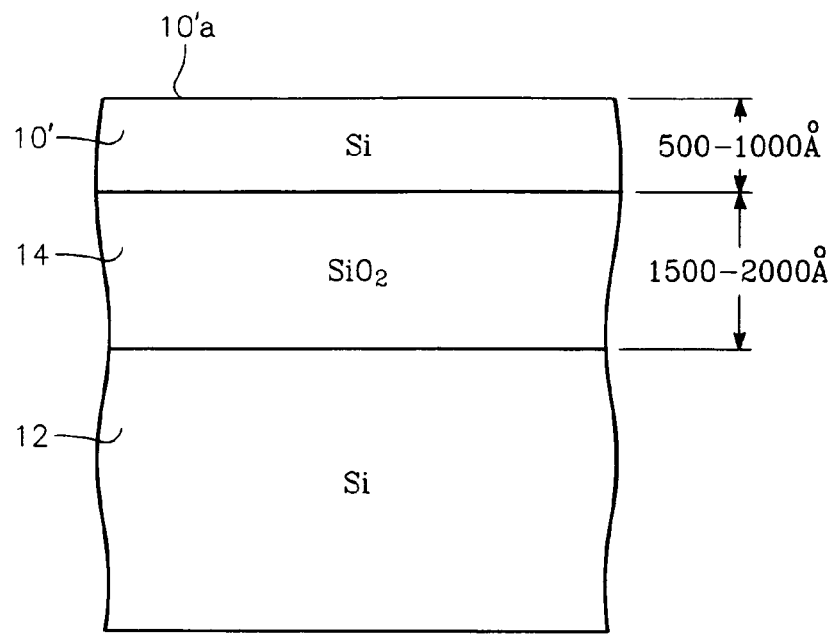
FIG. 4 is a cross-sectional view of a portion of a structure produced by the SOI fabrication process of FIGS. 1A through 1H.

FIG. 4 illustrates an SOI structure formed in the fabrication process of either FIGS. 1A–1H or FIGS. 3A–3H. A silicon substrate 12 has a thickness of a silicon wafer (about 2 mm). A silicon dioxide layer 14 is about 1500 to 2000 Angstroms in thickness. An active thin silicon layer 10' overlies the silicon dioxide layer 14 and has a thickness of about 500 to 1000 Angstroms. The silicon dioxide layer 14 was thermally grown either on the active silicon layer 10' prior to cleavage (in the sequence of FIGS. 1A–1H) or on the silicon substrate 12 (in the sequence of FIGS. 3A–3H).

Figure 5:
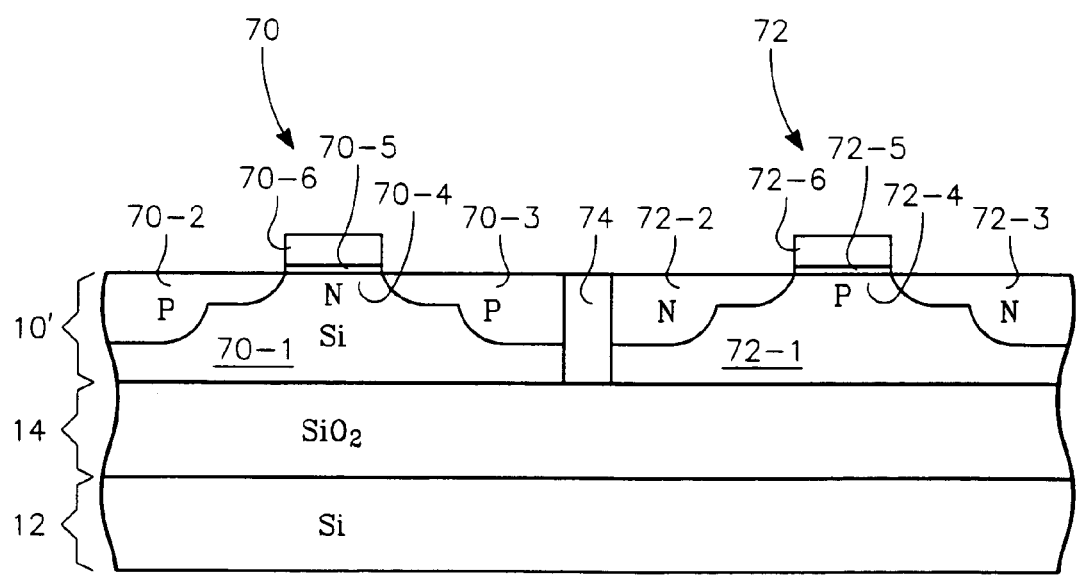
FIG. 5 illustrates a portion of the structure of FIG. 5 having microelectronic devices formed thereon.

FIG. 5 illustrates an exemplary microelectronic circuit structure that is formed on the SOI structure produced in the processes of FIGS. 1A–1H or 3A–3H. The microelectronic circuit structure of FIG. 5 includes complementary metal oxide semiconductor (CMOS) devices. Specifically, a PMOS transistor 70 formed in the active silicon layer 10' is separated from an NMOS transistor 72 by a shallow isolation trench 74 (whose height corresponds to the thickness of the active silicon layer 10') filled with an insulating material. The PMOS transistor 70 is formed by implanting a well region 70-1 with N-type dopant impurities. A thin gate oxide 70-5 is deposited over the channel 70-4 and a gate electrode 70-6 is formed over the thin gate oxide 70-5. Then source and drain regions 70-2, 70-3 are formed by implanting P-type dopant impurities. The source and drain regions 70-2, 70-3 are separated by a surface N-channel 70-4. The NMOS transistor 72 is formed by implanting a well region 72-1 with P-type dopant impurities. A thin gate oxide 72-5 is deposited over the channel 72-4 and a gate electrode 72-6 is formed over the thin gate oxide 72-5. Then source and drain regions 72-2, 72-3 are formed by implanting N-type dopant impurities. The source and drain regions 72-2, 72-3 are separated by a surface P-channel 70-4. The shallow isolation trench 74 is formed by removing or etching the active silicon layer 10' to form an empty trench 74 and then filling the trench with a high quality insulator material, such as silicon dioxide, as one example.

Figure 6:
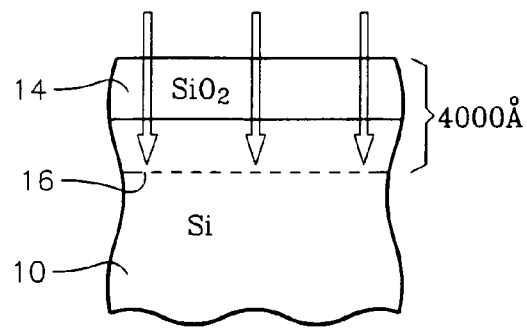
FIG. 6 depicts a cleavage ion implantation step carried out through an overlying oxide layer on a wafer.
Figure 7:
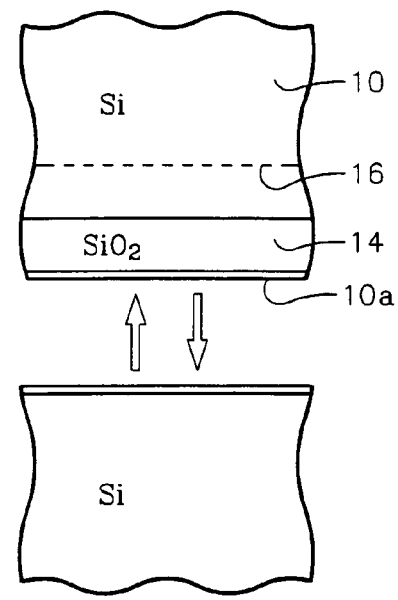
FIG. 7 illustrates the step of conjoining two wafer following the step of FIG. 6.
Figure 8:
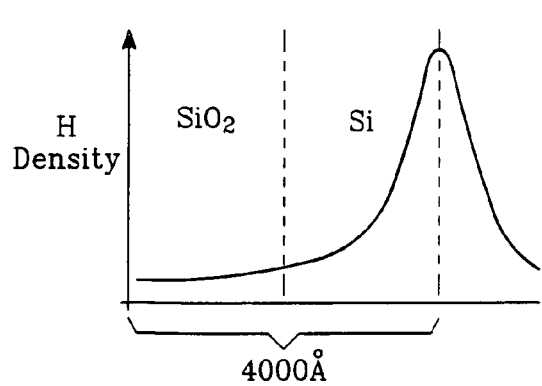
FIG. 8 depicts a desired ion implantation depth profile in the step of FIG. 6.

FIGS. 6 through 8 pertain to the cleavage ion implantation step of FIG. 1D as carried out in the torroidal source plasma immersion ion implantation reactor of FIG. 2A. FIG. 6 is a cross-sectional view of a portion of the oxidized wafer 10 during the implantation step, indicating the implantation of the hydrogen ions at a depth of about 4000 Angstroms (2000 Angstroms below the oxide layer 14) to form the cleavage plane 16. FIG. 7 illustrates that the oxidized wafer 10 having the implanted cleavage plane 16 is the turned upside down so that its top surface 10a faces top surface 12a of the unoxidized wafer 12. Preferably, both top surfaces 10a, 12a previously have received a wafer-to-wafer bond-enhancing surface activation oxygen ion implant in the step of FIG. 1C.

The two wafers 10, 12 are then pressed together. FIG. 8 illustrates the desired depth profile of the implanted ions in the cleavage plane 16. The profile peaks at a depth of 4000 Angstroms and preferably is sharp and steep in order to promote a clean break along the cleavage plane 16 in the separation step of FIG. 1G. How the torroidal source plasma immersion ion implantation reactor of FIG. 2A may be employed to achieve such a sharp implantation depth profile will be discussed below.

Figure 9:
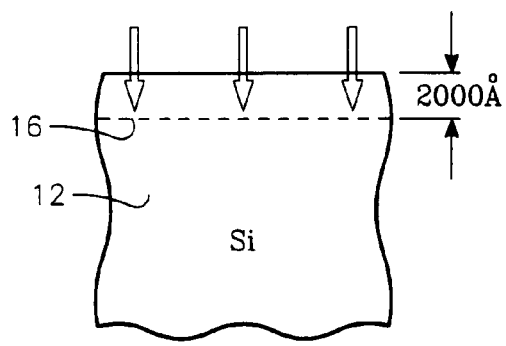
FIG. 9 depicts a cleavage ion implantation step carried directly on the exposed semiconductor surface of a wafer.
Figure 10:
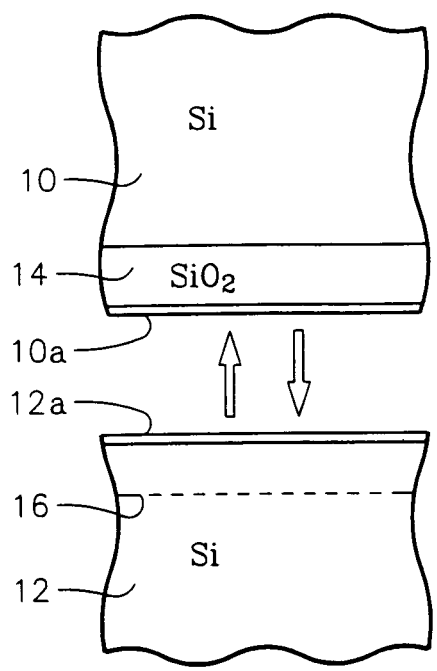
FIG. 10 illustrates the step of conjoining two wafers following the step of FIG. 9.
Figure 11:
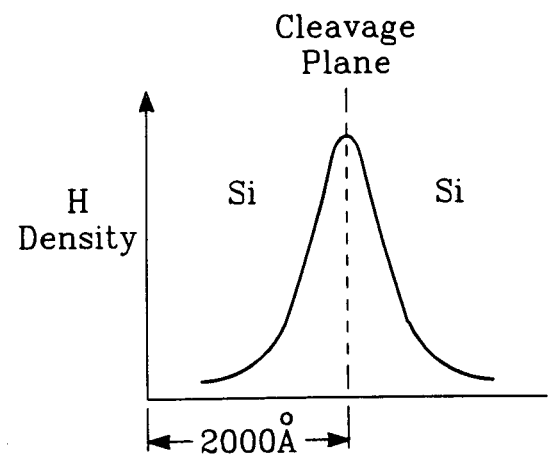
FIG. 11 depicts a desired ion implantation depth profile in the step of FIG. 9.

FIGS. 9 through 11 pertain to the cleavage ion implantation step of FIG. 3D in the alternative SOI fabrication sequence of FIGS. 3A–3H, as carried out in the torroidal source plasma immersion ion implantation reactor of FIGS. 2A AND 2B. FIG. 9 is a cross-sectional view of a portion of the unoxidized wafer 12 during the implantation step, indicating the implantation of the hydrogen ions at a depth of about 2000 Angstroms to form the cleavage plane 16. FIG. 10 illustrates that the unoxidized wafer 12 having the implanted cleavage plane 16 is the turned upside down so that its top surface 12a faces top surface 10a of the oxidized wafer 10. Preferably, both top surfaces 10a, 12a previously have received a wafer-to-wafer bond-enhancing surface activation oxygen ion implant in the step of FIG. 3C. The two wafers 10, 12 are then pressed together. FIG. 11 illustrates the desired depth profile of the implanted ions in the cleavage plane 16. The profile peaks at a depth of 2000 Angstroms and preferably is sharp and steep in order to promote a clean break along the cleavage plane 16 in the separation step of FIG. 3G. How the torroidal source plasma immersion ion implantation reactor of FIGS. 2A AND 2B may be employed to achieve such a sharp implantation depth profile will now be discussed.

Figure 12:
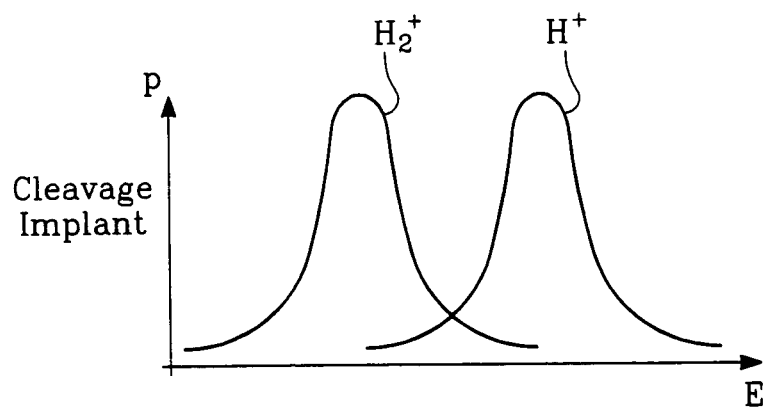
FIG. 12 depicts an ion population distribution as a function of ion energy in the case of incomplete dissociation of molecular hydrogen in the cleavage ion implantation step.

FIG. 12 illustrates the population distribution of molecular hydrogen and atomic hydrogen as a function of ion energy for the case in which the bias power generator 54 of FIG. 2A provides an RF (sine wave) voltage to the wafer support pedestal 28. The molecular (H2) hydrogen ions have twice the mass of the atomic hydrogen ions, and therefore have a kinetic energy of about half that of the atomic hydrogen ions at a given RF bias voltage level. Since the energy distribution is therefore spread out over a relatively large range, the depth profile of the implanted ions cannot be as sharp as the desired profile illustrated in FIG. 8 or FIG. 11. This is probably due at least in part to the fact that the sine wave form of the bias voltage of FIG. 13 requires the bias voltage to vary from a very small (zero) amplitude to a maximum peak amplitude once each cycle, resulting very small ion energies during a significant portion of each cycle. Thus, the ion energy distribution averaged over each RF cycle is necessarily spread out over a wide range, causing the ion implantation depth profile to be spread out. Another problem is the failure of the molecular hydrogen to dissociate more completely into atomic hydrogen, giving rise to a significant population of molecular hydrogen ions, having ion energies significantly less than the atomic hydrogen ions, which leads to a spreading of the ion implantation depth profile.

Figure 14:
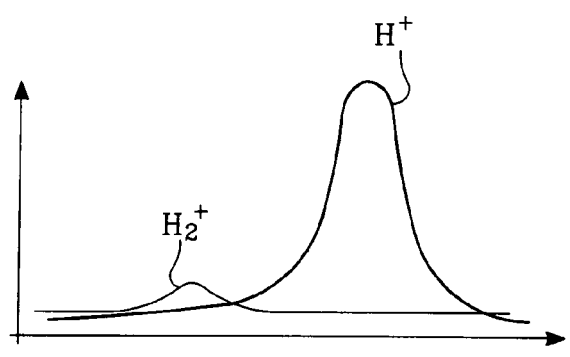
FIG. 14 depicts an ion population distribution as a function of ion energy in the case of nearly complete dissociation of molecular hydrogen in the cleavage ion implantation step.
Figure 15:
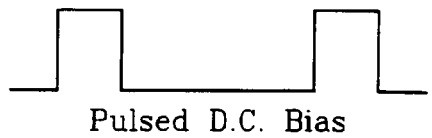
FIG. 15 illustrates a pulsed D.C. bias voltage waveform leading to the result illustrated in FIG. 14.

The sharp ion implantation depth profiles of FIGS. 8 and 11 are achieved as follows. First, a pulsed D.C. bias voltage is furnished by the bias power generator 54, rather than an RF voltage. This provides a uniform voltage over a prescribed duty cycle and therefore a more uniform distribution of ion energy about the peak bias voltage on the wafer 29. Significantly, since the voltage during the on duty cycle is the peak voltage, the ion energy is concentrated at energies corresponding to that peak bias voltage, providing a population distribution at much higher ion energies. Secondly, more complete dissociation of the molecular hydrogen ions into atomic hydrogen is achieved. This more complete dissociation is at least in part due to the greater ion energy attained using a pulsed D.C. bias voltage. The result is illustrated in the ion energy distribution of FIG. 14, showing a very small population of molecular hydrogen at the lower energy, with the vast majority of the ion population being atomic hydrogen at the higher energy (due to the more complete dissociation of molecular hydrogen), with a much sharper energy distribution (due to the more energy-uniform pulsed D.C. bias voltage waveform). The pulsed D.C. bias voltage waveform is illustrated in FIG. 15. The sharper energy population distribution of FIG. 14 results in the very sharp ion implantation depth profiles of FIGS. 8 and 11.

Figure 13:
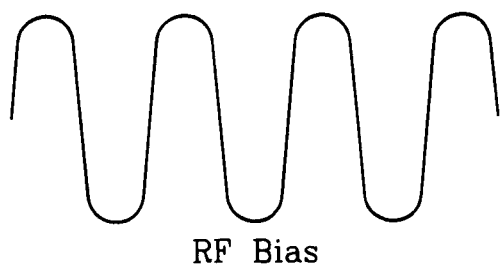
FIG. 13 illustrates a sinusoidal bias voltage waveform leading to the result illustrated in FIG. 12.

One advantage of using the pulsed D.C. bias voltage waveform of FIG. 15 is that the bias power required to attain a particular high sheath voltage (greater than 10 kV) on the wafer 29 is much less in the case of the pulsed D.C. bias waveform than the RF (sinusoidal) bias waveform of FIG. 13. For an implantation depth of 4000 Angstroms, a sheath voltage on the wafer must be on the order of about 40 kV. This requires about 5 kW of bias power in the case of the pulsed D.C. bias waveform of FIG. 15 and greater than 20 kW in the case of the RF bias waveform of FIG. 13. The generation of such high bias voltages may be achieved free of plasma breakdown or arcing by using a high voltage electrostatic wafer chuck (for the wafer support pedestal 28 of FIG. 2A) disclosed in co-pending U.S. application Ser. No. 10/646,533, filed Aug. 22, 2003 entitled PLASMA IMMERSION ION IMPLANTATION PROCESS USING A CAPACITIVELY COUPLED PLASMA SOURCE HAVING LOW DISSOCIATION AND LOW MINIMUM PLASMA VOLTAGE, by Kenneth Collins, et al., and assigned to the present assignee. Future SOI devices require thinner Si layers (less than 100 Angstroms) and therefore lower wafer biases are required (less than 10–15 kV). For these voltages, both pulsed DC and continuous RF can be used.

Figure 16A:
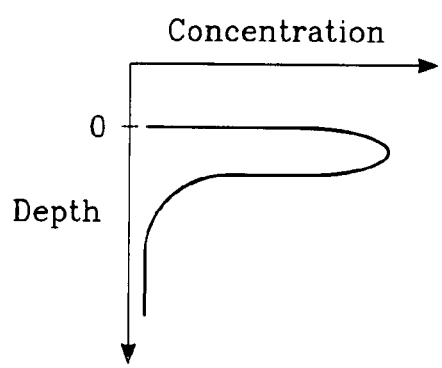
FIGS. 16A and 16B illustrate, respectively, the ion implantation depth profile and the corresponding implanted wafer surface in the surface activation ion implantation step.
Figure 16B:
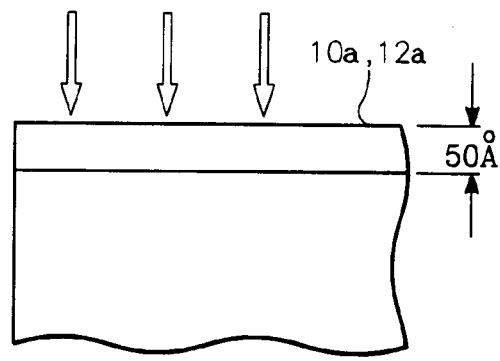

The low minimum ion energy levels of which the torroidal source plasma immersion ion implantation reactor of FIGS. 2A AND 2B is capable are of great advantage in carrying out the surface activation implant step of FIGS. 1C (or 3C). FIGS. 16A and 16B illustrate the desired ion implantation depth profile of that step in relation to the surface (i.e., the surface 10a, or 12a of FIG. 1C or FIG. 3C). FIG. 16A illustrates the ion implantation depth profile while FIG. 16B illustrates the corresponding layer topology of the implanted device. It is desirable, as indicated in FIG. 16B, that at least nearly the entire dose of implanted ions be concentrated within 50 Angstroms of the surface 10a or 12a, and that the peak of the distribution (FIG. 16A) be very close to the surface with little or no fall-off in the distribution between the distribution peak and the surface. Moreover, a graded fall-off in the depth distribution is required from the distribution peak and downward, to guarantee concentration within the top 50 Angstroms. This result is achieved primarily by implanting the ions (e.g., oxygen ions) at a very low ion energy, near the minimum ion energy of which the reactor of FIGS. 2A AND 2B is capable of providing. A low bias voltage is employed, accordingly (about 100 V, for example). The bias power may be continuous wave RF, or pulsed RF or pulsed D.C.

Figure 17A:
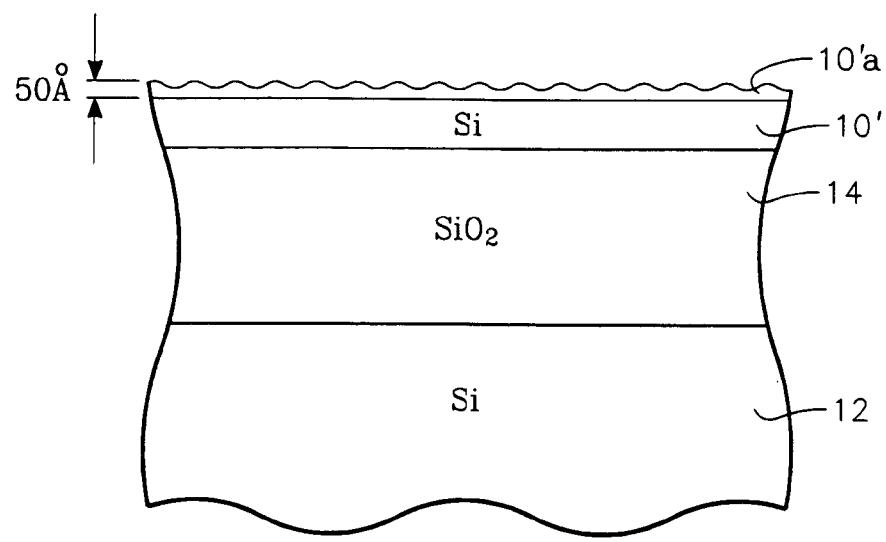
FIGS. 17A–17C and 18 illustrate, respectively, a very narrow depth profile and a corresponding pulsed D.C. bias voltage waveform.
Figure 17B:
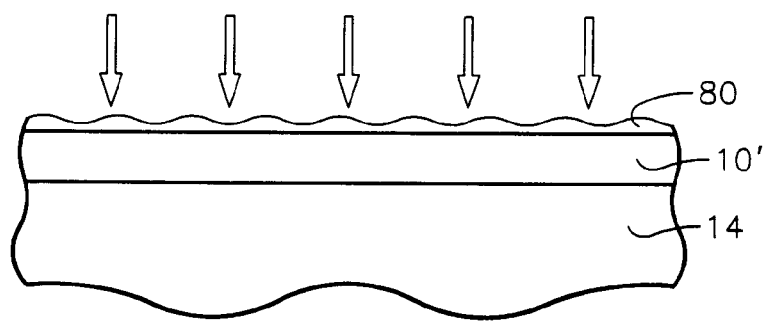
Figure 17C:
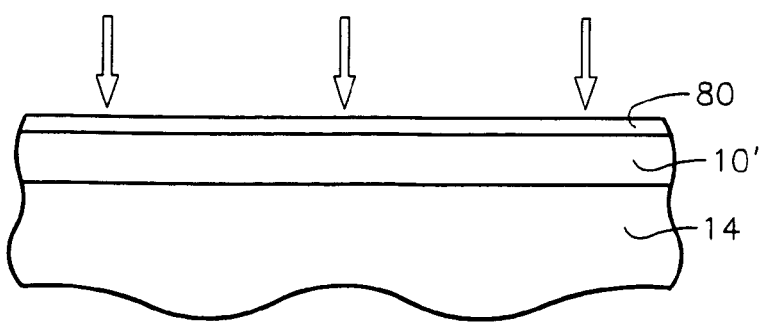

FIGS. 17A, 17B and 17C illustrate the surface smoothing implant step of FIG. 1H and FIG. 3H. Upon commencement of this step, the structure is as illustrated in FIG. 17A, in which the silicon active layer 10' has a rough and possibly amorphous or polycrystalline surface 10'a formed by the separation of the wafer at the cleavage plane 16, which is now the location of the new exposed top surface 10'a. In the next operation illustrated in FIG. 17B, a very low energy ion implantation step is carried out, preferably using an ion species of relatively high mass to compensate for the low energy and provide greater smoothing effect in the active layer 10'. The low ion energy is required because the active layer may be as thin as 500 Angstroms, so that the non-crystalline and rough portion or surface layer 80 in the active layer 10' formed upon cleavage along the plane 16 (FIG. 1E) may extend to a depth of only 50 Angstroms. Therefore, it is desirable to concentrate the implanted species within a depth of about 50 Angstroms. For this purpose, the very low minimum ion energy that can be attained in the torroidal source plasma immersion ion implantation reactor of FIGS. 2A and 2B is advantageous. A very low bias voltage (e.g., 50–100 volts) and a very low source power (e.g., 1000 W or less) may be required. The extremely low ion energy may greatly reduce the effect of the implanted ions, and therefore a massive species is preferably employed, such as Xenon or Argon, although a lighter species may possibly suffice in some cases. This implant step is therefore carried out at a low ion energy and a relatively high ion momentum. The resulting ion bombardment damage renders the surface layer 80 more amenable to re-crystallization and repair upon heating or annealing in a later step. In FIG. 17C, the SOI structure is annealed by heating it to about 1000 degrees C. This causes the non-crystalline surface layer 80 to re-crystallize and the rough surface 10'a to become smooth. The advantage of the surface smoothing implantation step (FIG. 17B) is that a shorter anneal time and lower anneal temperature may be used to repair the surface layer 80 and surface of the active layer 10'. In an alternative embodiment, initially a higher ion energy is used to provide higher sputtering and then the ion energy is reduced towards the end of the smoothing process to provide gentle smoothing. As another alternative, the smoothing ion implantation step is performed while the wafer is heated to a high temperature, for example greater than 600–700 C.

A very shallow ion implantation profile is required to confine the implanted Xenon or Argon ions within 50 Angstroms of the surface 10'a. Therefore, the torroidal source plasma immersion ion implantation reactor is employed to attain a very low ion energy, using a small bias voltage or wafer sheath voltage (e.g., about 100 V), a continuous RF, or pulsed D.C. bias voltage waveform and a low source power level (e.g., about 500 Watts).

In order to avoid contamination of the wafer during any of the plasma immersion ion implantation steps referred to above, the interior surfaces of the reactor vacuum chamber 20 (FIG. 2) are coated (or "seasoned") with a temporary film of a process-compatible material prior to introduction of the wafer into the vacuum chamber 20. This pre-implant seasoning step is particularly effective in preventing metallic contamination of the wafer surface. Such metallic contamination can cause shifts in the SOI device electrical behavior. The coating is formed on the interior chamber surfaces using plasma deposition techniques by a plasma formed inside the vacuum chamber using a process containing a precursor of the process-compatible material to be deposited. For example, if the process-compatible coating is silicon dioxide, then, prior to introduction of the wafer into the vacuum chamber 20, a gaseous precursor of silicon dioxide, such as a mixture of oxygen and silane gases, is fed into the vacuum chamber 20 by the gas distribution plate 30 and/or other gas injection apparatus of the reactor. A plasma is struck by applying RF source power to the applicator coil 44. Plasma operating parameters, including chamber pressure, gas flow rate, RF source power level, etc., are selected to promote the deposition of the selected species (e.g., silicon dioxide) onto the interior surface within the vacuum chamber. The plasma is maintained until a thin coating (e.g., of several thousands of angstroms in thickness) is deposited on all the interior surfaces of the vacuum chamber. As a result, no metallic surfaces remain exposed within the vacuum chamber 20. Then, the plasma is extinguished and the gases removed from the chamber 20. Thereafter, a wafer is introduced into the chamber and one of the foregoing plasma immersion ion implantation steps is performed. (Each of these ion implantation steps, i.e., the activation implant of FIG. 1C, the cleavage implant of FIG. 1D and the smoothing implant of FIG. 1H, may be performed in the same reactor at different times or in different reactors.) Upon completion of the particular implantation step, the seasoning coating (e.g., silicon dioxide) is removed from the interior chamber surfaces. This removal step may be performed by introducing fluorine radicals or radicals of other etchant species into the chamber, using for example a remote plasma source connected to the main processing chamber through a vacuum port. While the seasoning layer that is deposited on the interior vacuum chamber surfaces is disclosed above as being silicon dioxide, other substances may be employed instead, such as silicon nitride, germanium oxide, germanium nitride, silicon carbide, germanium carbide, and or hydrides of the foregoing substances, for example.

Figure 18:
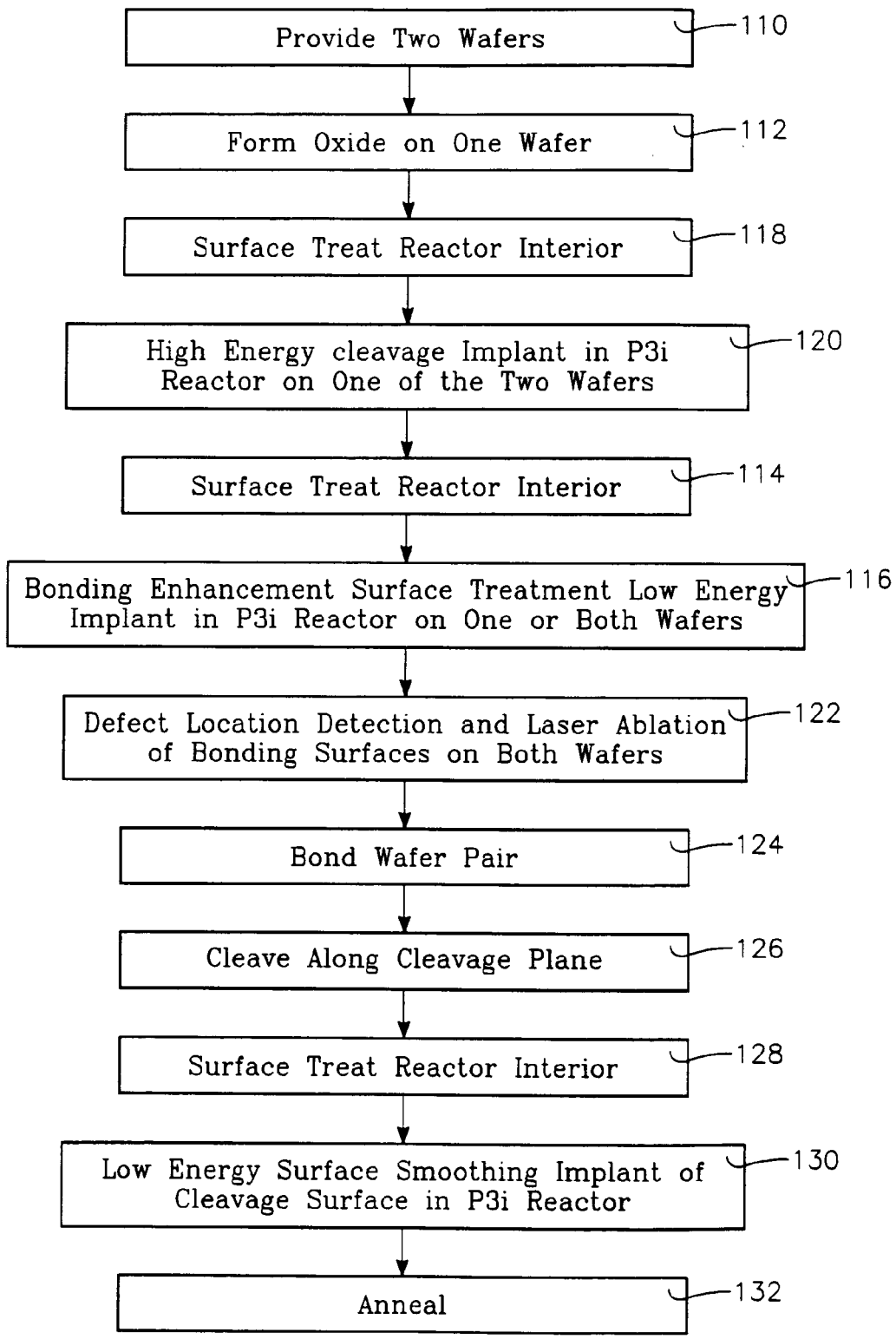

One embodiment of the SOI fabrication process, in which the foregoing chamber seasoning process precedes each ion implantation step, is illustrated in the flow diagram of FIG. 18. A pair of semiconductor (e.g., silicon) wafers is provided as in FIG. 1A (block 110 of FIG. 18). One of the wafers is oxidized in the thermal oxidation step to form a silicon dioxide layer as in FIG. 1B (block 112 of FIG. 18). Next, in block 118 of FIG. 18, a chamber seasoning step is performed on the same or a different plasma immersion ion implantation reactor to be used in the cleavage implant step. The wafer is then introduced into that chamber and the cleavage implantation step of FIG. 1D is performed (block 120 of FIG. 18). In preparation for the surface activation implantation step, the pre-implant seasoning step is performed by coating the interior surfaces of a plasma immersion ion implantation reactor with a process compatible material such silicon dioxide using an in-situ plasma deposition process (block 114 of FIG. 18). Then, the wafer is introduced into the seasoned plasma immersion ion implantation reactor and the surface activation implant step of FIG. 1C is performed (block 116 of FIG. 18). Preferably, after the wafer is removed from the reactor, the seasoning coating is removed by an in-situ plasma etch process. The laser defect ablation process of FIG. 1E is performed, preferably on both of the pair of wafers (block 122 of FIG. 18). The two wafers are then placed together and bonded as in the step of FIG. 1F (block 124 of FIG. 18). The cleaved wafer is then separated along the implanted cleavage plane as in FIG. 1G (block 126 of FIG. 18). Next, in block 128 of FIG. 18, a chamber seasoning step is performed on the same or a different plasma immersion ion implantation reactor to be used in the surface smoothing implant step. The wafer is then introduced into that chamber and the surface smoothing implantation step of FIG. 1H is performed (block 130 of FIG. 18). The surface repair or smoothing process is then completed by an anneal step (block 132 of FIG. 18).

Figure 19:
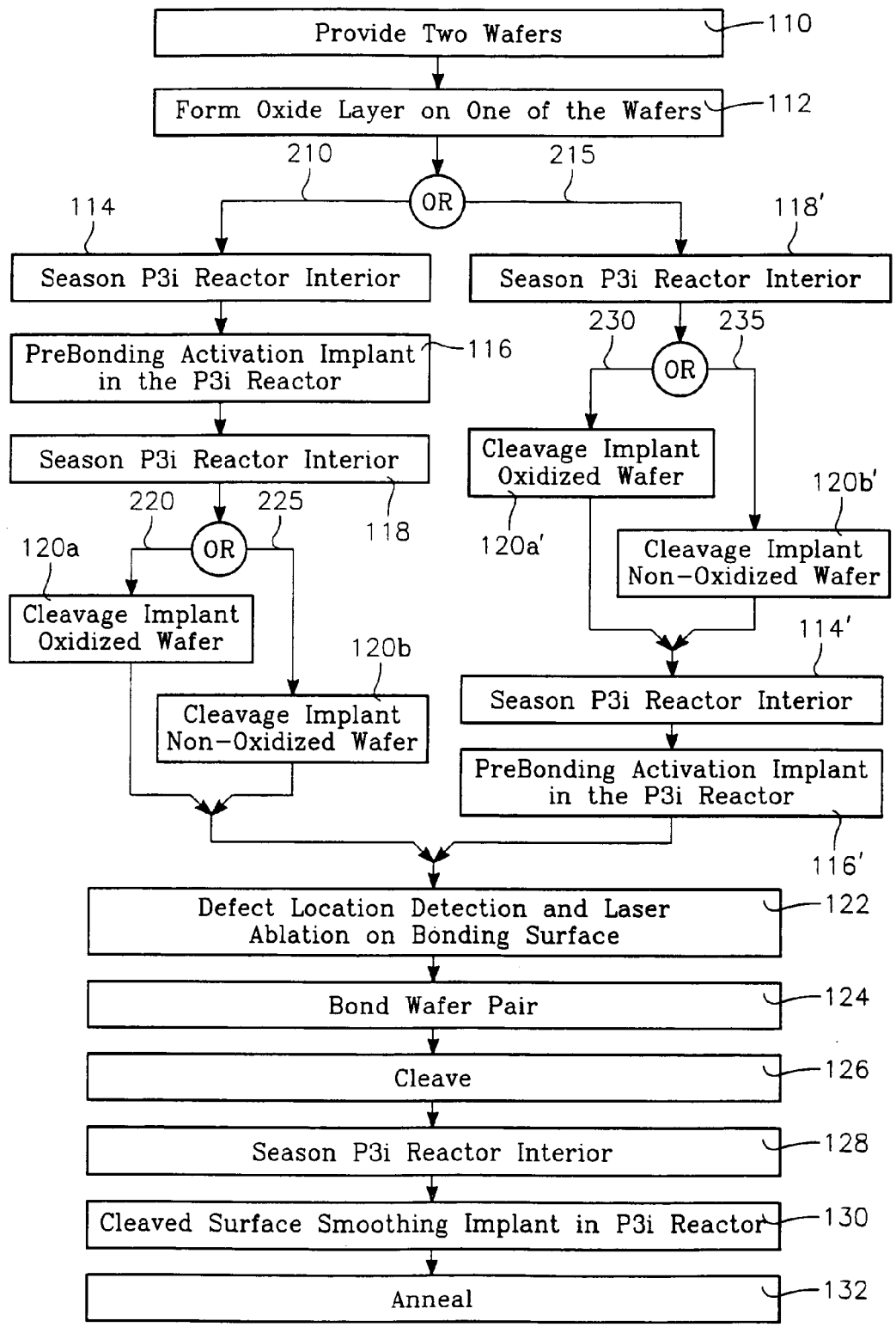
FIGS. 19 and 20 illustrate, respectively, a very broad depth profile and a corresponding sinusoidal bias voltage waveform.

While FIG. 18 depicts one species of the SOI fabrication process, FIG. 19 is a flow diagram reflecting numerous alternatives for performing different species of the SOI fabrication process, in which the order of certain steps can be altered. In FIG. 19, the first two steps 110, 112 are the same as steps 110, 112 of FIG. 18. Thereafter, one of two alternative branches 210, 215 may be taken.

In branch 210, the steps 114, 116 and 118 of FIG. 19 are the same as steps 114, 116, 118 of FIG. 18. This is followed in FIG. 19 by a choice between two branches 220, 225 in which the cleavage implant step is either carried out on the oxidized wafer (block 120a of branch 220) or on the unoxidized wafer (block 120b of branch 225).

In branch 215, the cleavage implant is performed prior to the activation implant. Therefore the first step 118' in branch 215 is to season the interior surfaces of a plasma immersion ion implantation reactor, and corresponds to step 118 of FIG. 18. Next, a choice is made between branches 230 and 235. In branch 230 the cleavage implant is carried out on the oxidized wafer (step 120'a) and in branch 235 the cleavage implant is carried out on the unoxidized wafer (step 120'b). Thereafter, the interior surfaces of a plasma immersion ion implantation reactor are seasoned (step 114') and the activation ion implantation step is performed (step 118').

The alternative branches 210, 215 of FIG. 19 merge at the step of block 122, which is the laser defect ablation step 122 of FIG. 18. The subsequent steps 124, 126, 128, 130 and 132 in FIG. 19 are the same as steps 124, 126, 128, 130 and 132 of FIG. 18.

As mentioned earlier in this specification, each of the ion implantation steps of the SOI fabrication process may be carried out at different times in the same plasma immersion ion implantation reactor or in different ion implantation reactors. It is inherently more efficient to provide a different plasma immersion ion implantation reactor for the different ion implantation steps, because the process parameters are different for each of the implant steps. For example, the surface activation ion implant step requires oxygen to be implanted with a depth profile that is sharply distributed near the surface, while the cleavage ion implant step requires hydrogen to be implanted at a much greater depth. And, the surface smoothing implant requires implantation of a heavy species (e.g., xenon) at the minimum possible depth with the narrowest possible depth profile. Therefore, by providing at least two or three different plasma immersion ion implantation reactors, each reactor may be customized to perform a particular one of these three implantation steps.

Figure 20:
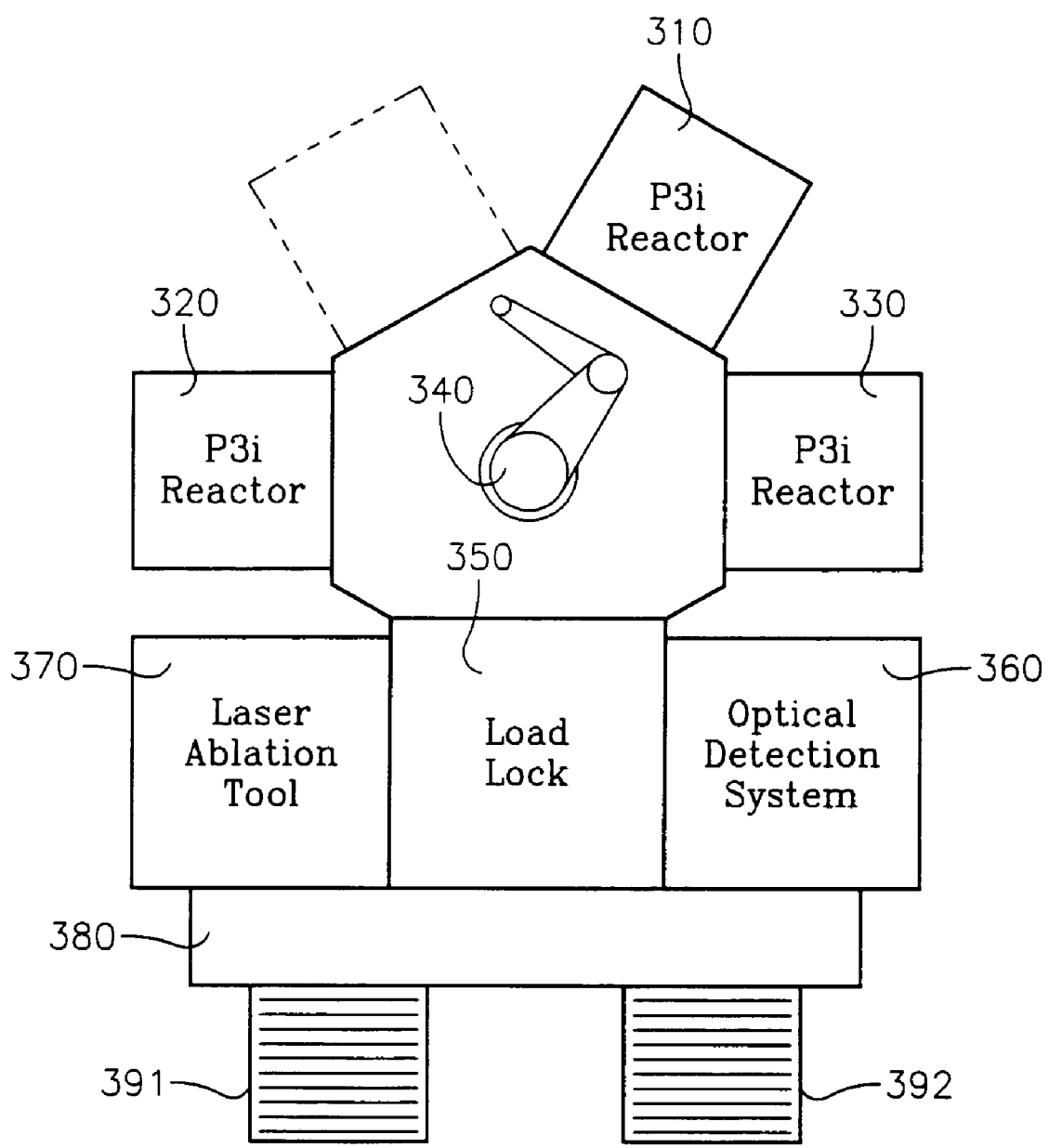

A system including three such reactors for performing the SOI fabrication processes described above is illustrated in FIG. 20. Three torroidal source plasma immersion ion implantation reactors 310, 320, 330 of the type illustrated in FIGS. 2A and 2B are coupled to respective ports of a vacuum robot 340. The vacuum robot 340 has another port couple to a load lock 350. The load lock 350 is coupled to an optical wafer surface contamination detection system 360 on one side and a laser ablation tool 370 on the other side. The laser ablation tool 370 is guided by a data base generated for each wafer in the detection system 360. Together, the detection system 360 and the ablation tool 370 perform the laser defect ablation step of FIGS. 1E or 3E. The load lock 350 is further coupled to a wafer cassette handler 380 capable of receiving two 300 mm wafer cassettes 391, 392.

The reactor 310 is specially configured to perform the wafer surface oxygen activation implant step of FIG. 1C. Its bias power generator (54 of FIG. 2) is set to produce a bias voltage on a wafer of about 100–500 volts with a continuous RF or pulsed D.C. waveform, and its process gas supply can deliver silane and oxygen for the pre-implant interior surface seasoning step, pure oxygen for the surface activation implant step, and a fluoride compound gas for post-implant removal of the seasoning layer. The reactor 320 is configured to perform the high energy cleavage implant step. Its bias power generator is set to produce a very large bias voltage on the wafer (e.g., ~30 kV) using a pulsed D.C. waveform, its process gas supply can deliver silane and oxygen for the pre-implant seasoning step, pure hydrogen gas for the cleavage implant step, and a fluoride compound gas for post-implant removal of the seasoning layer. The reactor 330 is configured to perform the surface smoothing implant step. Its bias power generator (54 of FIG. 2) is set to produce a bias voltage on a wafer of about 50–100 volts with a continuous RF or pulsed D.C. waveform, and its process gas supply can deliver silane and oxygen for the pre-implant interior surface seasoning step, pure Xenon (for example) for the surface smoothing implant step, and a fluoride compound gas for post-implant removal of the seasoning layer.

While the invention has been described in detail by specific reference to preferred embodiments, it is understood that variations and modifications thereof may be made without departing from the true spirit and scope of the invention.

What is claimed is:

1. A method of fabricating a semiconductor-on-insulator structure from a pair of semiconductor wafers, each of said wafers having opposing first and second surfaces, said method comprising:
    forming an oxide layer on at least a first surface of a first one of said wafers;
    performing a cleavage ion implantation step on one of said pair of wafers by ion implanting a second species to define a cleavage plane across a diameter of said wafer at a predetermined depth below the top surface of said one wafer;
    performing a bonding enhancement implantation step by ion implantation of a first species in the first surface of at least either of said pair of wafers;
    bonding said pair of wafers together by placing the first surfaces of said pair of wafers onto one another so as to form an semiconductor-on-insulator structure;
    separating said one wafer along said cleavage plane so as to remove a portion of said one wafer between said second surface and said cleavage plane, whereby to form an exposed cleaved surface of a remaining portion of said one wafer on said semiconductor-on-insulator structure;
    smoothing said cleaved surface;
    wherein said bonding enhancement implantation step comprises plasma immersion ion implantation of said first species; and
    wherein the step of plasma immersion ion implantation of said first species comprises:
    placing either of said pair of wafers in a first process zone;
    introducing a first process gas containing a precursor of said first species;
    generating a first oscillating plasma current from said first process gas in a first closed torroidal path extending through a first reentrant conduit external of said first process zone and through said first process zone.

2. The method of claim 1 wherein the step of plasma immersion ion implantation further comprises:
    generating a second oscillating plasma current from said first process gas in a second closed torroidal path separate from and transverse to said first torroidal path and extending through a second reentrant conduit external of said first process zone and through said first process zone, said first and second closed torroidal paths intersecting in said first process zone.

3. The method of claim 2 wherein:
said first process zone is defined between the wafer therein and a first overlying ceiling; and
the step of introducing a first process gas comprises injecting the first process gas into said first process zone through said ceiling.

4. The method of claim 1 further comprising attracting ions from said plasma current to the top surface of the wafer in the process zone with an ion energy corresponding to an implant depth profile peaking at or near the top surface of the wafer in the process zone.

5. The method of claim 4 wherein the step of attracting ions comprises coupling plasma bias power to the wafer in the process zone to produce a plasma sheath voltage at the top surface thereof corresponding to said implant depth profile.

6. The method of claim 5 wherein the step of coupling plasma bias power comprises coupling a pulsed D.C. voltage waveform to the wafer.

7. The method of claim 1 wherein said first species comprises oxygen.

8. The method of claim 1 wherein said first species comprises one of nitrogen, hydrogen, silicon, germanium.

9. The method of claim 1 wherein said cleavage implantation step comprises plasma immersion ion implantation of said second species.

10. The method of claim 9 wherein the step of plasma immersion ion implantation of said second species comprises:
placing said one wafer in a second process zone;
introducing a second process gas containing a precursor of said second species;
generating a third oscillating plasma current from said second process gas in a third closed torroidal path extending through a third reentrant conduit external of said second process zone and through said second process zone.

11. The method of claim 10 wherein the step of plasma immersion ion implantation further comprises:
generating a fourth oscillating plasma current from said second process gas in a fourth closed torroidal path separate from and transverse to said third torroidal path and extending through a third reentrant conduit external of said second process zone and through said second process zone, said third and fourth closed torroidal paths intersecting in said second process zone.

12. The method of claim 10 wherein:
said second process zone is defined between said one wafer and a second overlying ceiling; and
the step of introducing a second process gas comprises injecting the second process gas into the second process zone through the second ceiling.

13. The method of claim 10 further comprising attracting ions from the plasma current to the top surface of said one wafer with an ion energy corresponding to an implant depth profile peaking at said cleavage plane.

14. The method of claim 13 wherein the step of attracting ions comprises coupling plasma bias power to said one wafer to produce a plasma sheath voltage at the top surface of said one wafer corresponding to the implant depth profile peaking at said cleavage plane.

15. The method of claim 14 wherein the step of coupling plasma bias power comprises coupling a pulsed D.C. voltage waveform to the wafer.

16. The method of claim 9 wherein said smoothing step comprises plasma immersion ion implantation of a third species into said cleaved surface.

17. The method of claim 16 wherein the step of plasma immersion ion implantation of said third species comprises:
placing said semiconductor-on-insulator structure in a third process zone;
introducing a third process gas containing a precursor of said third species;
generating a fifth oscillating plasma current from said third process gas in a fifth closed torroidal path extending through a fifth reentrant conduit external of said third process zone and through said third process zone.

18. The method of claim 17 wherein the step of plasma immersion ion implantation of said third species further comprises:
generating a sixth oscillating plasma current from said third process gas in a sixth closed torroidal path separate from and transverse to said fifth torroidal path and extending through a sixth reentrant conduit external of said third process zone and through said third process zone, said fifth and sixth closed torroidal paths intersecting in said third process zone.

19. The method of claim 17 wherein:
said third process zone is defined between said semiconductor-on-insulator structure and a third overlying ceiling; and
the step of introducing a third process gas comprises injecting the third process gas into said third process zone through said third ceiling.

20. The method of claim 17 further comprising attracting ions from said plasma current to said cleaved top surface of the semiconductor-on-insulator structure with an ion energy corresponding to an implant depth profile peaking at or near said cleaved surface.

21. The method of claim 20 wherein the step of attracting ions comprises coupling plasma bias power to the semiconductoron-insulator structure to produce a plasma sheath voltage at the top surface thereof corresponding to the implant depth profile peaking at the cleaved surface.

22. The method of claim 21 wherein the step of coupling plasma bias power comprises coupling a pulsed D.C. voltage waveform to the semiconductor-on-insulator structure.

23. The method of claim 17 wherein said third species comprises a relatively heavy species.

24. The method of claim 23 wherein said third species comprises one of xenon, argon, nitrogen, silicon, germanium.

25. The method of claim 1 wherein said second species comprises hydrogen.

26. The method of claim 1 further comprising:
prior to the step of bonding said pair of wafers together, performing a defect removal step on either or both said pair of wafers, comprising:
optically detecting locations of defects including contamination in the top surface of the wafer; and
ablating said defects by directing a laser beam to said locations.

27. The method of claim 1 wherein a bonding enhancement implantation step is performed on the top surface of each of said pair of wafers.

* * * * *